United States Patent [19]

Abe et al.

[11] Patent Number: 5,705,879
[45] Date of Patent: Jan. 6, 1998

[54] DISCHARGE TUBE DRIVING DEVICE AND PIEZOELECTRIC TRANSFORMER THEREFOR

[75] Inventors: Tooru Abe, Kumagaya; Sigeru Jomura, Tokyo; Toshiyuki Tamakai, Kashiwa, all of Japan

[73] Assignee: Hitachi Metals, Ltd., Tokyo, Japan

[21] Appl. No.: 723,959

[22] Filed: Sep. 26, 1996

Related U.S. Application Data

[63] Continuation of Ser. No. 378,370, Jan. 25, 1995, abandoned.

[30] Foreign Application Priority Data

| Jan. 27, 1994 | [JP] | Japan | 6-024798 |
| Jul. 28, 1994 | [JP] | Japan | 6-176538 |
| Aug. 30, 1994 | [JP] | Japan | 6-205293 |

[51] Int. Cl.$^6$ .................................... H01L 41/08
[52] U.S. Cl. ............................ 310/359; 310/316
[58] Field of Search .................... 310/316–319, 310/359

[56] References Cited

U.S. PATENT DOCUMENTS

| 3,636,386 | 1/1972 | Kawada | 310/318 |
| 3,690,309 | 9/1972 | Pluzhnikov | 310/318 |
| 3,736,446 | 5/1973 | Berlincourt et al. | 310/359 |
| 3,764,848 | 10/1973 | Berlincourt | 315/55 |
| 3,790,826 | 2/1974 | Kawada | 310/318 |
| 4,054,936 | 10/1977 | Ansai et al. | 310/318 |
| 4,459,505 | 7/1984 | Lim | 310/318 |
| 5,440,195 | 8/1995 | Ohnishi et al. | 310/359 |

FOREIGN PATENT DOCUMENTS

| 0605901 | 7/1994 | European Pat. Off. | H01L 41/07 |
| 2278165 | 7/1975 | France | H01L 41/10 |
| 5175398 | 6/1976 | Japan | G09F 9/00 |
| 52113578 | 9/1977 | Japan | H05B 41/14 |
| 5229164 | 9/1977 | Japan | 310/316 |
| 5526600 | 7/1980 | Japan | H05B 41/24 |
| 0114492 | 5/1993 | Japan | 310/316 |
| 5114492 | 5/1993 | Japan | H05B 41/24 |
| 0438009 | 1/1973 | U.S.S.R. | 310/318 |
| 0438009 | 7/1974 | U.S.S.R. | 310/318 |
| 0646392 | 2/1979 | U.S.S.R. | 310/316 |
| 1493447 | 11/1977 | United Kingdom | 310/359 |

OTHER PUBLICATIONS

Herts, S., Piezoelectric Transformers, vol. 24, No. 7, Mar. 31, 1988, pp. 444–445.

*Primary Examiner*—Thomas M. Dougherty
*Attorney, Agent, or Firm*—Sughrue, Mion, Zinn, Macpeak & Seas, PLLC

[57] ABSTRACT

A driving device for driving a discharge tube, wherein a pair of electrodes is formed on a piezoelectric transformer, and a voltage, which is periodically inverted, is applied to the electrodes. This design makes it possible to take out high voltage from the piezoelectric transformer due to the piezoelectric effect, ignite a discharge tube, and keep the discharge tube ON. Thus, a smaller and thinner driving device for a discharge tube can be achieved.

4 Claims, 19 Drawing Sheets

TIME AXIS

FIG. 10A  TUBE CURRENT  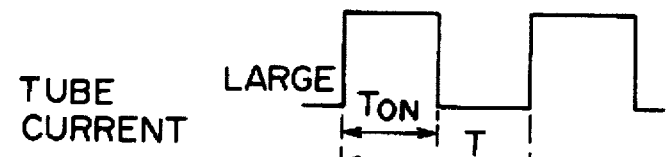
FIG. 10B  TUBE CURRENT  SMALL 
FIG. 11
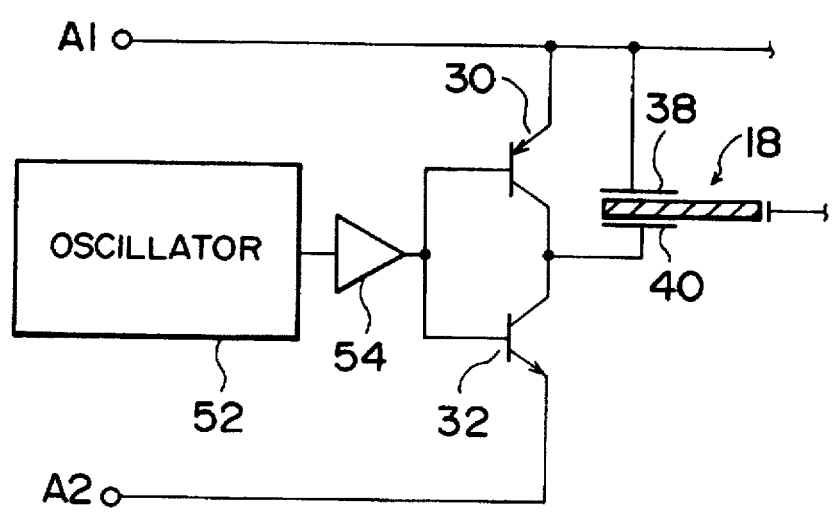

DISCHARGE TUBE DRIVING DEVICE AND PIEZOELECTRIC TRANSFORMER THEREFOR

This is a continuation of application Ser. No. 08/378,370 filed Jan. 25, 1995 now abandoned.

BACKGROUND OF THE INVENTION

1. Field of the Invention

The present invention relates to a driving device and a piezoelectric transformer therefor for use in a discharge tube such as a cold-cathode tube which is employed for, e.g. a liquid crystal display.

2. Description of the Related Art

In general, liquid crystal displays do not emit light by themselves, and therefore, backlit type liquid crystal displays are currently dominant. In the backlit type liquid crystal display, a discharge tube such as a cold-cathode tube is provided at the rear or side of the liquid crystal display.

Driving such a discharge tube requires a high AC voltage of more than several hundreds of volts although the voltage depends on the length and diameter of the discharge tube. Typically used for the driving device of the discharge tube for producing the high AC voltage is a high-frequency inverter which employs an electromagnetic transformer shown in FIG. 32. In the discharge tube driving device shown in FIG. 32, high output voltage $V_4$ generated in a secondary winding 75 of the electromagnetic transformer 70 is applied to a discharge tube 60 such as a cold-cathode tube via a ballast capacitor 81 which restricts tube current Io, thus causing the discharge tube 60 to emit light.

As another method, a discharge tube driving device employing a piezoelectric transformer has been disclosed in Japanese Patent Publication No. 55-26600, Japanese Patent Laid-Open No. 52-113578, and Japanese Patent Laid-Open No. 5-114492. The piezoelectric transformer has a significantly simpler construction than the electromagnetic transformer and therefore it enables the achievement of a smaller and thinner driving device at lower cost. The principle and features of the piezoelectric transformer are disclosed in "Characteristics and Applications of Piezoelectric Transformer" in the July 1971 issue of "Electronic Ceramics" which is a technical journal published by GAKKENSHA.

The principle of a Rosen type piezoelectric transformer will now be described with reference to the Rosen piezoelectric transformer shown in FIG. 33. A pair of input electrodes 4 and 5 is formed by silver-baking them onto the top and bottom surfaces of the left half of a plate-shaped piezoelectric element 2 made of a lead-zirconate-titanate (PZT) material. In the same manner, an output electrode 6 is formed on the right end surface. The left half of the ceramic element 2 is polarized in the direction of thickness (downward in the figure); the right half is polarized in the direction of length (leftward in the figure) beforehand.

In the piezoelectric transformer thus configured, when an AC voltage of approximately the same frequency of the lengthwise natural resonant frequency of the ceramic element 2 is applied across the input electrodes 4 and 5 from an AC voltage source 8, the ceramic element 2 develops intense mechanical vibration lengthwise. This causes the right-half power generating section to produce electric charge due to the piezoelectric effect, and output voltage Vo appears between the output electrode 6 and one of the input electrodes, e.g. the input electrode 5.

The chart given in FIG. 34 shows the load resistance characteristic with respect to output voltage of the Rosen type piezoelectric transformer; the chart given in FIG. 35 shows the load resistance characteristic with respect to efficiency. In this case, AC input voltage Vi is 10 V, the driving mode is the full-wavelength mode, the piezoelectric material used is HCEPC-28 (made by Hitachi Metals, Ltd.), and the ceramic element measures 28 mm long, 7.5 mm wide, and 1.0 mm thick. As may be seen from the charts, the Rosen type piezoelectric transformer is capable of providing an output voltage 700 V, a 70-fold step-up ratio in a zone of a relatively high load resistance, e.g. 3 MΩ although the efficiency is low, only 50% or less. Conversely, the Rosen type piezoelectric transformer is capable of accomplishing high efficiency of 90% or higher in a zone around a load resistance of 100 kΩ although the output voltage is 85 V, a 8.5-fold step-up ratio.

In the 1970s, a piezoelectric transformer for high-voltage power source for use in a TV receiver was a popular research topic. The piezoelectric transformer made use of the zone of the relatively high 10 load resistance stated above. This type of piezoelectric transformer, however, has not yet been put in practical use because it cannot surpass the electromagnetic transformer mainly because of the problem of the heat generated by the element due to the operation in the low-efficiency zone. On the other hand, a typical apparatus, which incorporates the piezoelectric transformer based on the other zone where high efficiency can be obtained for relatively low resistance, requires a high DC input voltage of 25 V, unavoidably resulting in a battery assembly which was too large for use in a battery-driven, portable information terminal or personal computer.

Portable information terminals or personal computers which use liquid crystal displays are required to operate on low voltage at high efficiency to achieve smaller power battery assemblies and prolonged service. Accordingly, the driving devices for the discharge tubes used for such applications are required to provide a high step-up ratio and high efficiency to enable them to produce high output voltage from low input voltage. The discharge tube driving device employing the conventional Rosen type piezoelectric transformer cannot meet the two requirements stated above.

SUMMARY OF THE INVENTION

Accordingly, an object of the present invention is to eliminate the shortcomings described above.

Another object of the present invention is to provide a discharge tube driving device which permits reduced size and thickness by employing a piezoelectric transformer.

To these ends, according to one aspect of the present invention, there is provided a driving device for driving a discharge tube, which driving device is constituted by a piezoelectric transformer and an exciting means which periodically inverts the voltage applied to input electrodes of the piezoelectric transformer, an output of the piezoelectric transformer being supplied to the discharge tube.

According to the aforesaid aspect of present invention, the exciting means applies voltage, which is periodically inverted, to a pair of input electrodes provided on the piezoelectric transformer. This causes the piezoelectric transformer to develop intense mechanical vibration due to the electrostrictive effect, and voltage is generated because of the piezoelectric effect from the mechanical vibration. In this case, the capacitance of a power generating section of the piezoelectric transformer is smaller than a driving section thereof, producing high output voltage which ignites a discharge tube. Once discharge is initiated, stable discharge is continued at an intersection of the characteristic of the piezoelectric transformer and that of the discharge tube.

In particular, the use of a self-excited type, which is designed to feed back a part of the output of the piezoelectric transformer so as to self-excite the aforesaid exciting means, makes it possible to provide stable outputs even if the natural resonant frequency of the piezoelectric transformer changes due to a temperature change, time-dependent change or the like because the frequency of the applied voltage can be changed accordingly.

Further, a tube current detection section may be provided for detecting the tube current of the discharge tube, so that the tube current can be controlled according to detected values, thereby controlling the light emission from the discharge tube.

A further object of the present invention is to provide a discharge tube driving device which employs a piezoelectric transformer which is capable of achieving both high step-up ratio and high efficiency.

To this end, according to another aspect of the present invention, there is provided a discharge tube driving device which is equipped with a DC input power source, an electromagnetic transformer with a primary winding thereof connected to the DC input power source; a switching means which is connected to the other end of the primary winding; a piezoelectric transformer which is connected to a secondary winding of the electromagnetic transformer; and a driving/oscillating means for causing the switching means to be self-oscillated by using a feedback signal received from the piezoelectric transformer, outputs of the piezoelectric transformer being supplied to a discharge tube.

According to the aspect of the present invention stated above, a voltage, which has been boosted in accordance with the turn ratio of the primary winding to the second winding of the electromagnetic transformer, is applied to the input side of the piezoelectric transformer. Hence, the piezoelectric transformer outputs high AC voltage even for relatively low load resistance, thus allowing a discharge tube such as a cold-cathode tube to be driven at high efficiency.

Even higher efficiency and step-up ratio can be achieved when the resonant frequency based on the inductance of the primary winding or secondary winding of the electromagnetic transformer and a parallel capacitance, which includes the parasitic capacitance of the switching means, or a parallel capacitance which includes the input capacitance of the piezoelectric transformer, is set to nearly coincide with the natural resonant frequency of the piezoelectric transformer itself.

Yet another object of the present invention is to provide a multilayer type piezoelectric transformer which accomplishes both high step-up ratio and high efficiency.

To this end, according to a further aspect of the present invention, there is provided a multilayer type piezoelectric transformer having an area, which has been polarized in the direction of length, and an area, which has been polarized in the direction of thickness, piezoelectric elements and internal electrodes being alternately laminated in the area which has been polarized in the direction of thickness, and the internal electrodes being connected to external elements every other layer and burned therewith as one piece.

According to the above-mentioned aspect of the present invention, in the driving section of the multilayer type invention, input voltage is applied to the respective laminated thin layers. Therefore, in comparison with the conventional single-board type, the multilayer type is capable of multiplying the step-up ratio approximately by the number of laminated layers. Hence, the multilayer type piezoelectric transformer provides high voltage even for relatively low load resistance, enabling a discharge tube such as a cold-cathode tube to be driven at high efficiency.

Even higher efficiency and step-up ratio can be accomplished when the resonant frequency based on the inductance of an inductor and the parallel capacitance, which includes the parasitic capacitance of the switching means or the input capacitance of the multilayer type piezoelectric transformer, is set to nearly coincide with the natural resonant frequency of the multilayer type piezoelectric transformer itself.

Other objects and advantages of the present invention will be apparent from the following description taken in conjunction with the accompanying figures and claims.

BRIEF DESCRIPTION OF THE DRAWINGS

FIG. 10 consists of FIG. 10(A) and FIG. 10(B) which show the waveforms of controls signals observed when tube current is detected to control the emission of light;

FIG. 11 is a block diagram illustrative of a separately excited driving circuit;

DESCRIPTION OF THE PREFERRED EMBODIMENT

The preferred embodiments of the present invention will now be described with reference to the accompanying drawings.

Figure 1:
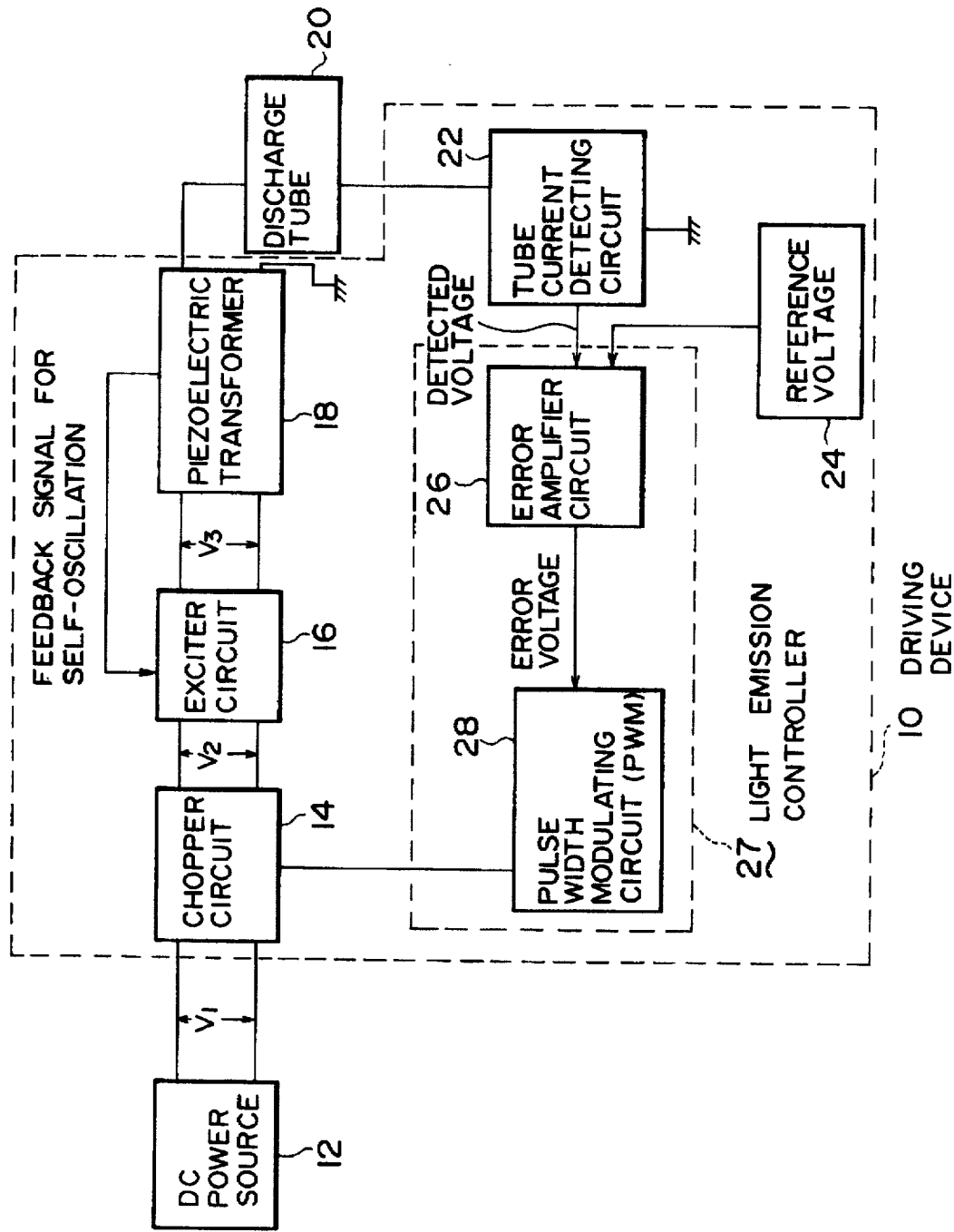
FIG. 1 is a block diagram which shows the construction of an example of a discharge tube driving device in accordance with the present invention.
Figure 2:
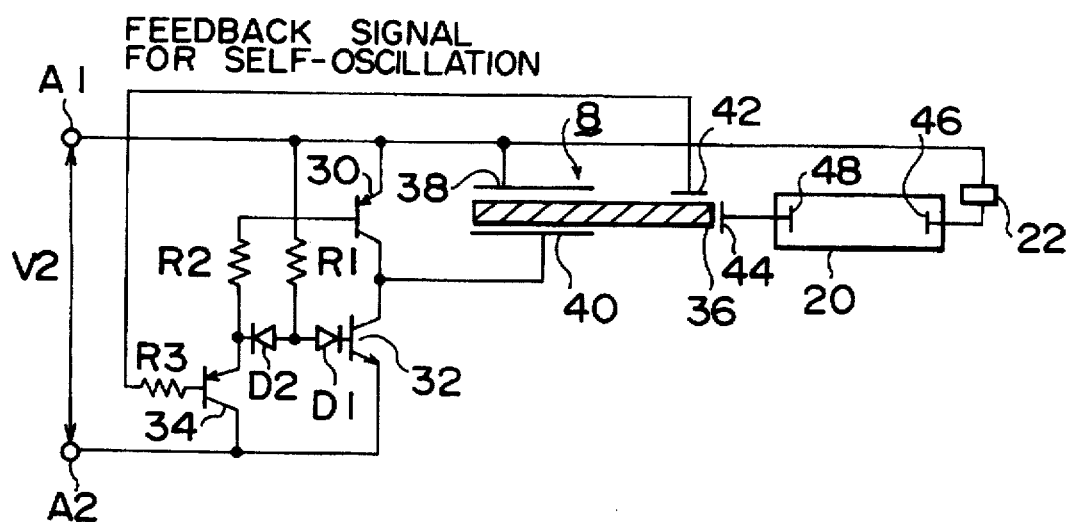
FIG. 2 is a circuit diagram which shows a self-excited driving circuit which is the essential part of the driving device shown in FIG. 1.
Figure 3:
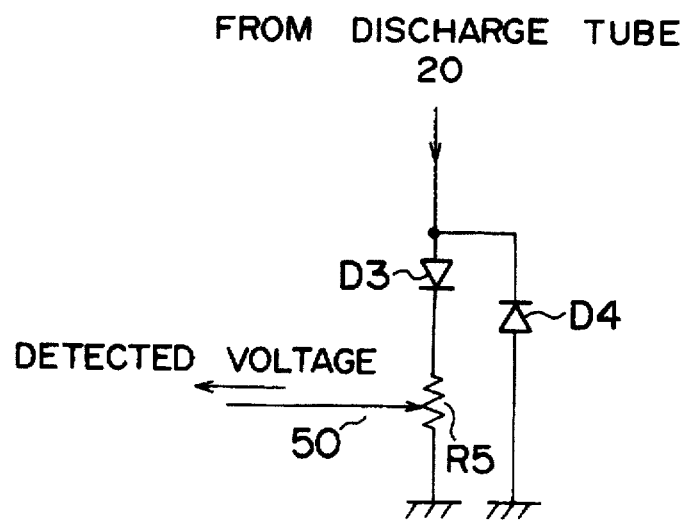
FIG. 3 is a circuit diagram of a current detecting circuit shown in FIG. 1.
Figure 4:
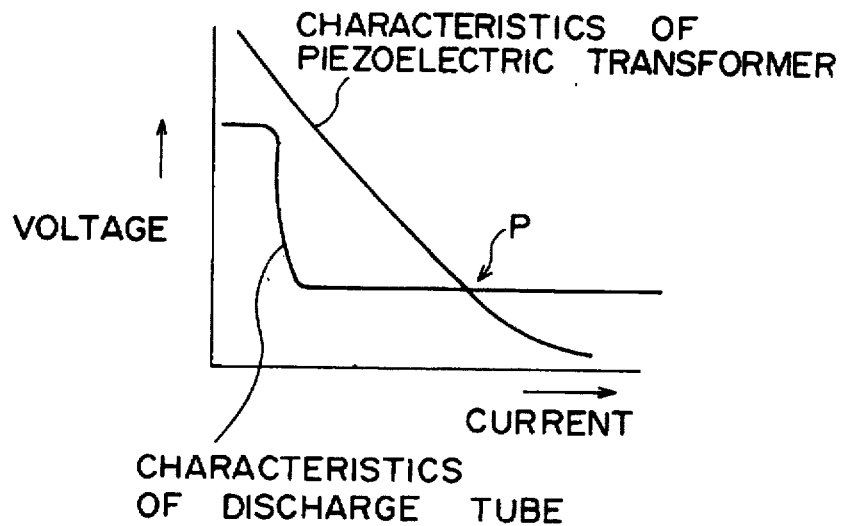
FIG. 4 is the characteristic curves which show the characteristics of a discharge tube and piezoelectric transformer.

FIG. 1 is the block diagram which shows an example of a discharge tube driving device in accordance with the first aspect of the present invention; FIG. 2 is the circuit diagram which shows a self-excited driving circuit which is the essential part of the driving device shown in FIG. 1; FIG. 3 is the circuit diagram of a current detecting circuit shown in FIG. 1; and FIG. 4 is the characteristic curves showing the characteristics of the discharge tube and of the piezoelectric transformer.

As illustrated, a driving device 10 for a discharge tube has a chopper circuit 14 for increasing or decreasing a DC voltage V1 supplied from a DC power source 12 to a desired voltage. An output voltage V2 of the chopper circuit 14 is supplied to an exciter circuit 16 serving as the exciter which characterizes the present invention.

The exciter circuit 16 functions to apply a voltage V3, which inverts periodically, to a piezoelectric transformer 18. The piezoelectric transformer 18 consists of a piezoelectric ceramic element, which will be discussed later; it generates high electric power at the output side when it is subjected to the application of the aforesaid voltage. The output of the piezoelectric transformer 18 is applied to a discharge tube 20 such as a cold-cathode tube to ignite it and continue the discharge.

Connected to the discharge tube 20 is a tube current detecting circuit 22 serving as a tube current detector for detecting the current flowing through it, the detected values being connected to a light emission controller 27 which controls the output of the piezoelectric transformer 18 so as to adjust the light emission of the discharge tube 20. More specifically, the light emission controller 27 is constituted by an error amplifier circuit 26 amplifying the voltage difference between the voltage, which is received from the tube current detecting circuit 22 and which indicates a detected value, and a pulse width modulator (PWM) circuit 28, for example, which performs pulse width modulation wherein the width of output pulse is changed in accordance with the error voltage received from the circuit 26. The control signal issued from the PWM circuit 28 is used to control the pulse width of the chopper circuit, thereby regulating the output voltage V2.

The circuit configuration of the exciter circuit 16 and the piezoelectric transformer 18, which characterize the present invention, will now be described in conjunction also with FIG. 2.

As illustrated, the exciter circuit 16 is self-excited; it includes two transistors of, e.g. a first switch transistor 30 consisting of a pnp transistor, and a second switch transistor 32 consisting of an npn transistor, the two switch transistors being connected through the collectors thereof to provide complementary outputs. The emitter of the first switch transistor 30 is connected to one terminal A1 to which the voltage V2 is applied. The emitter of the second switch transistor is connected to the other terminal A2 to which the voltage V2 is applied.

A transistor 34 consisting of, e.g. a pnp transistor, is provided to control the base currents of the two transistors 30 and 32.

The terminal A1 is connected to the base of the second switch transistor 32 via a first resistor R1 and a first diode D1, the forward direction of the first diode D1 being the direction toward the aforesaid base. The base of the first switch transistor 30 is connected to the emitter of the transistor 34 via the second resistor R2. A second diode D2, the forward direction of which is the direction toward the emitter, is connected between the emitter of the transistor 34 and a point where the first resistor R1 and the first diode D1 are connected.

The collector of the transistor 34 is connected to the terminal A2 and the base thereof is connected to a third resistor R3.

Figure 33:
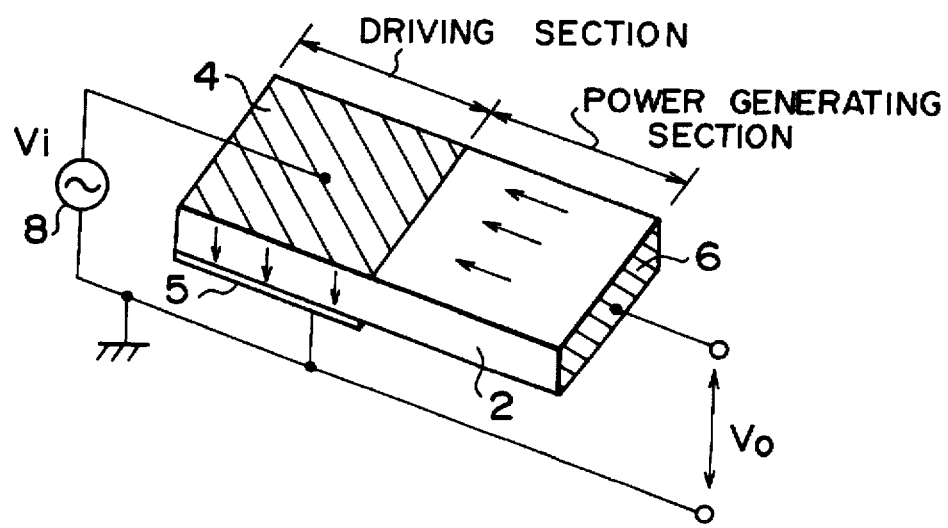
FIG. 33 is an explanatory view which is illustrative of the operating principle of a Rosen type piezoelectric transformer.

The piezoelectric transformer 18 shares the same construction as that shown in FIG. 33; it has a thin-plate piezoelectric ceramic element 36 made of, e.g. a lead-zirconate-titanate material which is fired. The ceramic element 36 measures, for example, 28 mm long, 7.5 mm wide, and 2.0 mm thick approximately. A pair of input electrodes 38 and 40 is formed by, for example, silver-baking them onto the top and bottom surfaces of the driving section (on the left side in the drawing) of the ceramic element 36. Further, an output electrode 44 is formed on the end surface of the power generating section which is the right half of the ceramic element 36, a feedback electrode 42 being provided apart from the input and output electrodes. The areas of the respective electrodes 38, 40, and 44 are set so that the capacitances generated among the electrodes are set to optimum values. One of the input electrodes 38 is connected to the terminal A1 and the other input electrode 40 is connected to the point where the collectors of the first switch transistor 30 and the second switch transistor 32 are connected. The feedback electrode 42 is connected to the third resistor R3.

The terminal A1 is connected to one electrode 46 of the discharge tube 20 via the tube current detecting circuit 22 and the output electrode 44 is connected to the other electrode 48.

The tube current detecting circuit 22 is constituted by a pair of diodes D3 and D4 which are connected in parallel so that the forward directions thereof are opposite from each other as shown in FIG. 3. A variable resistor R5 is connected in series with a diode D3 which is provided so that the forward direction thereof becomes the output electrode 44 side of the ceramic element 36, the detected voltage, which indicates the current value, being taken out through a moving terminal 50 thereof.

The following describes the operation of the embodiment thus constructed.

The DC voltage V1 supplied from the DC power source 12 is stepped up or down by the chopper circuit 14 in accordance with the control signal received from the PWM 28 to provide the DC voltage V2 which is supplied to the exciter circuit 16. The exciter circuit 16 applies the voltage V3, which is inverted periodically, to the piezoelectric transformer 18 to expand or contract the piezoelectric transformer 18. This causes the piezoelectric transformer 18 to generate voltage due to the piezoelectric effect; a part of the generated voltage is returned as the self-oscillation feed signal to the exciter circuit 16, the majority of the generated voltage being supplied to the discharge tube 20 to ignite it and continue the discharge.

The then tube current of the discharge tube is detected by the tube current detecting circuit 22 and the detected voltage is compared with a reference voltage 24 by the error amplifier circuit 26 to output an error voltage. Based on the error voltage, the PWM 28 carries out pulse width modulation to produce a control signal which is supplied to the chopper circuit 14 so as to control the output voltage V2, thus regulating the light emission in the discharge tube 20 as stated above.

Specific details of the operation in the exciter circuit 16 will now be given.

In FIG. 2, when the DC voltage V2 is applied to the terminals A1 and A2, currents are allowed to flow into the base of the second switch transistor 32 via the first resistor R1 and the first diode D1 to turn the transistor 32 ON. This causes the voltage V3 (V2) to be applied to the input electrodes 38 and 40 of the piezoelectric transformer 18 to charge an input capacitance thereof.

Due to the charging, negative voltage appears at the feedback electrode 42 and the base of the transistor 34 is subjected to forward bias through the third resistor R3, turning the transistor 34 ON. The moment the transistor 34 is turned ON, the first switch transistor 30 is turned ON and the second switch transistor 32 is turned OFF, causing the input capacitance of the piezoelectric transformer 18 to be discharged. Due to the discharging, positive voltage appears at the feedback electrode 42 and therefore the base of the transistor 34 is subjected to inverse bias through the third resistor R3, turning the transistor 34 OFF. Hence, the moment the transistor 34 is turned ON, the first switch transistor 30 is turned OFF and the second switch transistor 32 is turned back ON. After that, the same series of operations is repeated and high-frequency voltage is applied to the input electrodes 38 and 40 of the piezoelectric transformer 18. As a result, a boosted high-frequency voltage appears between the input electrode 38 and the output electrode 44, the high-frequency voltage being supplied to the electrodes 46 and 48 to cause the discharge tube 20 such as a cold-cathode tube to emit light.

In this case, the inversion of the voltage applied to the input electrodes 38 and 40 is the self-oscillation implemented by the voltage generated at the feedback electrode 42 provided on the piezoelectric transformer 18. This means that the operating frequency is determined by the natural resonant frequency of the piezoelectric transformer 18 itself. For this reason, even if the resonant frequency of the piezoelectric transformer 18 varies due to temperature changes, time-dependent changes, or changes in load, the operating frequency varies with such changes, making it possible to drive the piezoelectric transformer at an optimum frequency for efficiency at all times.

Further, as shown in FIG. 4, the characteristic of the piezoelectric transformer is expressed by the relationship between the output current and the output voltage; the output voltage slowly decreases as the output current increases. The characteristic of the discharge tube is expressed by the relationship between the current and the voltage, wherein the voltage shows a sudden change at a certain point as illustrated. Hence, the piezoelectric transformer supplies a high output voltage during a non-discharging period of time. As a result, the discharge tube 20 initiates discharging. The moment the discharging is started, the output voltage from the piezoelectric transformer 18 goes down. After that, stable discharging is continuously carried out at intersection P between the characteristic curve of the piezoelectric transformer and the characteristic curve of the discharge tube.

As it is obvious from the characteristic curves, although the piezoelectric transformer 18 is not capable of providing large current, it is capable of generating high voltage with no load, making it extremely compatible with the characteristic of the discharge tube 20 such as a cold-cathode tube which has a negative characteristic.

Further, since the piezoelectric transformer 18 cannot provide large current as stated above, no excessive short-circuit current flows through it even if, e.g. the discharge tube, which is the secondary, is short-circuited. This eliminates the need of providing a protective circuit which is required when an electromagnetic transformer is employed.

There is still another advantage. Most backlighting systems for liquid crystal displays to which the discharge tube 20 is applied require light controllers for controlling the brightness of the backlight. The embodiment enables the operator to change the value of the variable resistor R5 to a proper value to change the output voltage V2 supplied from the chopper circuit 14 to a proper value, thereby increasing or decreasing the tube current, i.e. increasing or decreasing the emission of light. For instance, increasing the output voltage V2 increases the output voltage V3 provided by the exciter circuit 16. As a result, the power supplied from the piezoelectric transformer 18 to the discharge tube 20 increases, leading to an increased tube current.

Figure 5:
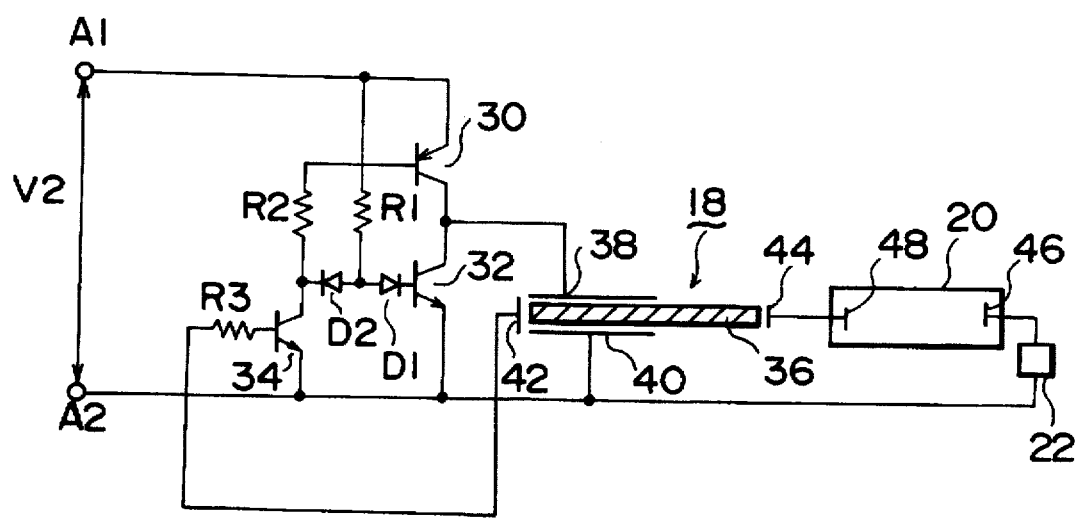
FIG. 5 is a circuit diagram which shows another self-excited driving circuit

FIG. 2 shows the example wherein the exciter circuit 16 is self-excited; the self excitation may be carried out by using the construction illustrated in FIG. 5. The self-excited oscillation circuit shown in FIG. 5 is configured by reversing the positive and negative relationship in the circuit shown in Rig. 2. Specifically, the input electrode 38 is connected to the connection point of the collectors of the first and second switch transistors 30 and 32 rather than to the terminal A1; the input electrode 40 is connected to the terminal A2. The electrode 46 of the discharge tube 20 is connected to the terminal A2 rather than to the terminal A1, via the tube current detecting circuit 22. Further, as the transistor 34, an npn transistor is used, the emitter thereof being connected to the terminal A2. The connection of other elements is the same as that shown in FIG. 2.

The operation implemented with such a circuit configuration will now be explained. First, when the DC voltage V2 is applied to the terminals A1 and A2, current is allowed to flow into the base of the second switch transistor 32 through the first resistor R1 and the first diode D1, thereby turning the transistor 32 ON. Positive voltage appears at the feedback electrode 42, causing the base of the transistor 34 to be subjected to forward bias via the third resistor R3, turning the transistor 34 ON. The moment the transistor 34 is turned ON, the first switch transistor 30 is turned ON and the second switch transistor 32 is turned OFF, thus charging the input capacitance of the piezoelectric transformer 18. The charging causes negative voltage to appear at the feedback electrode 42, which in turn causes the base of the transistor 34 to be subjected to inverse bias through the third resistor R3. This turns the transistor 34 OFF.

The moment the transistor 34 is turned OFF, the first switch transistor 30 is inversely biased, allowing current to flow into the base of the second switch transistor 32, turning the transistor 32 ON. This causes the input capacitance between the input electrodes 38 and 40 of the piezoelectric transformer 18 to be discharged and positive voltage appears at the feedback electrode 42. After that, the same series of operations is repeated to keep the discharge tube 20 ON.

This self-excited exciter circuit is also capable of exhibiting the same advantages as those explained in reference to FIG. 2.

The examples illustrated in FIG. 2 and FIG. 5 employ two switch transistors to drive the piezoelectric transformer. The example shown in FIG. 6 uses a single switch transistor (a field-effect transistor in this example). An E-class amplifier circuit is configured by an equivalent circuit composed of a choke coil 51, a switch transistor 31, and the piezoelectric transformer 18. The E-class amplifier circuit was proposed by N. O. Sokal et al. in the United States in 1975; it is explained on pages 153 to 155 of "Story about Amplification" written by Genzaburo Kuraishi, published by Nikkan Kogyo Shimbunsha. The E-class amplifier circuit has the same self-excited oscillation mechanism as that explained in the examples given above; the exciter thereof, however, performs the E-class operation and therefore the input voltage applied to the piezoelectric transformer exhibits a half-wave sinusoidal voltage waveform, causing lower loss in the switch transistors and a larger amplitude value of the resonant frequency component of the input voltage supplied to the piezoelectric transformer than that in the examples shown in FIG. 2 and FIG. 5. Hence, higher output voltage Vo can be generated from the same DC voltage V2. Moreover, the feedback signal for self-excitation is obtained from the output electrode 44 without providing the piezoelectric transformer 18 with the feedback electrode 42 in this embodiment. This method also enables the self-oscillation.

Figure 6:
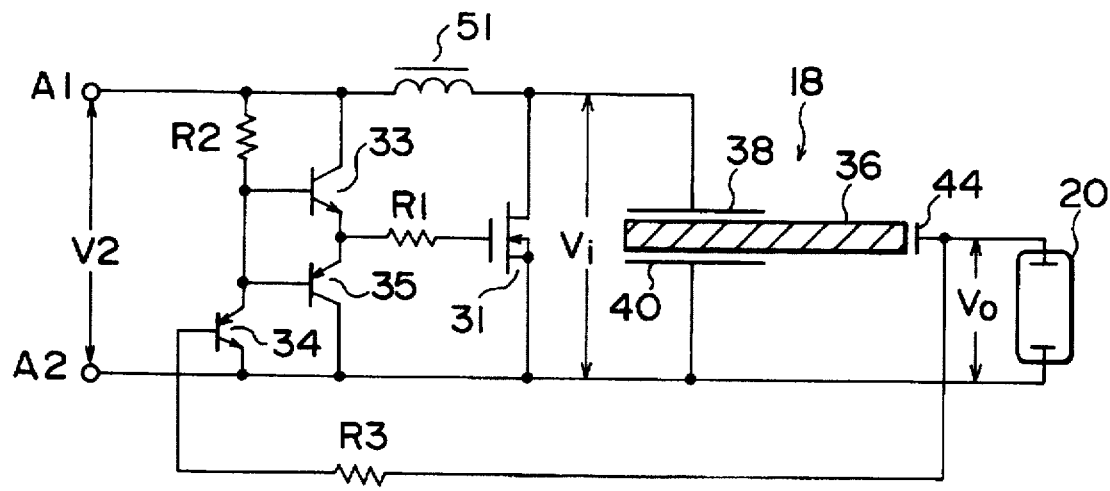
FIG. 6 is a circuit diagram which shows still another self-excited driving circuit.
Figure 7:
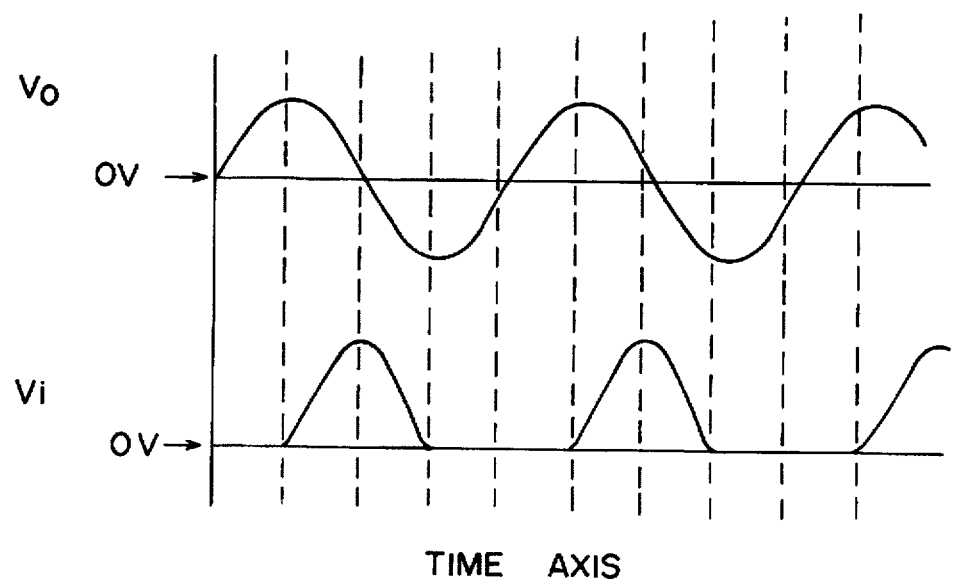
FIG. 7 shows the actual operation waveforms of the piezoelectric transformer observed at input voltage Vi and output voltage Vo in an embodiment shown in FIG. 6.

FIG. 7 shows the actual waveforms of the input voltage Vi and the output voltage Vo of the piezoelectric transformer which are observed at the time of the discharge of the cold-cathode tube in the embodiment illustrated in FIG. 6. In this embodiment, the DC voltage V2 is 20 V and the exciting frequency is 122 kHz, the piezoelectric transformer measuring 28 mm in full length, 7.5 mm wide, and 1.0 mm thick. The input voltage Vi exhibits the half-wave sinusoidal waveform as previously stated, indicating the E-class operation. The output voltage Vo is clamped by the discharge maintaining voltage of the cold-cathode tube and the tube current is restricted by the internal impedance of the piezoelectric transformer. This eliminates the need for the ballast capacitor located between the cold-cathode tube and the electromagnetic transformer which used to be employed for a conventional cold-cathode tube driving circuit.

Figure 8:
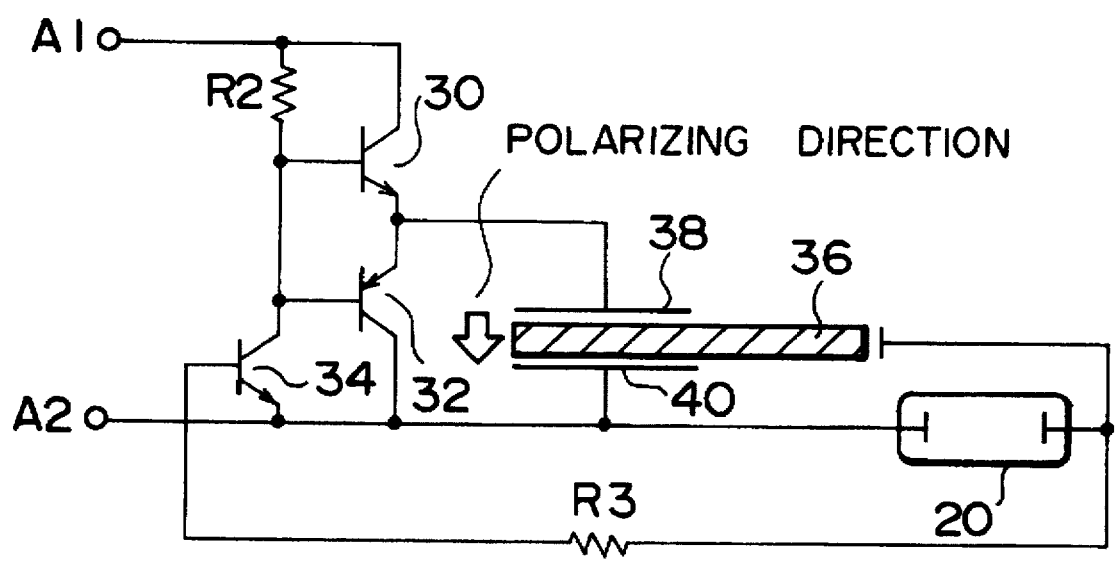
FIG. 8 is a circuit diagram which shows yet another self-excited driving circuit.

Self-oscillation can be achieved also by the circuit configuration shown in FIG. 8 which is composed of the circuit of FIG. 6 from which the choke coil 51, the switch transistor 31, and the first resistor have been removed. In this example, however, the phase relationship between the input voltage and the feedback signal of the piezoelectric transformer needs to be different from that of the example shown in FIG. 6 by 180°; therefore, if the same piezoelectric transformer is used, self-oscillation is carried out in a half-wavelength wavelength mode. Accordingly, the oscillating frequency in this example is 61 kHz which is half of that in the example of FIG. 6. The half-wavelength mode is an operation mode wherein a half-wavelength wave constantly exists over the full length of the piezoelectric transformer. The full-wavelength mode is an operation mode wherein a wave of one wavelength constantly exists over the full length of the piezoelectric transformer (the examples shown in FIG. 2, FIG. 5, and FIG. 6 described above are all in the full-wavelength mode). The example shown in FIG. 8 can be placed in the full-wavelength mode simply by changing the polarizing direction of the piezoelectric transformer exactly in the opposite direction from the direction of the arrow pointing from the electrode 38 to the electrode 40. More specifically, connecting the electrode 38 to the terminal A2 and the electrode 40 to the emitters of the switch transistors 30 and 32 accomplishes self-oscillation at 122 kHz in the full-wavelength mode.

Figure 9:
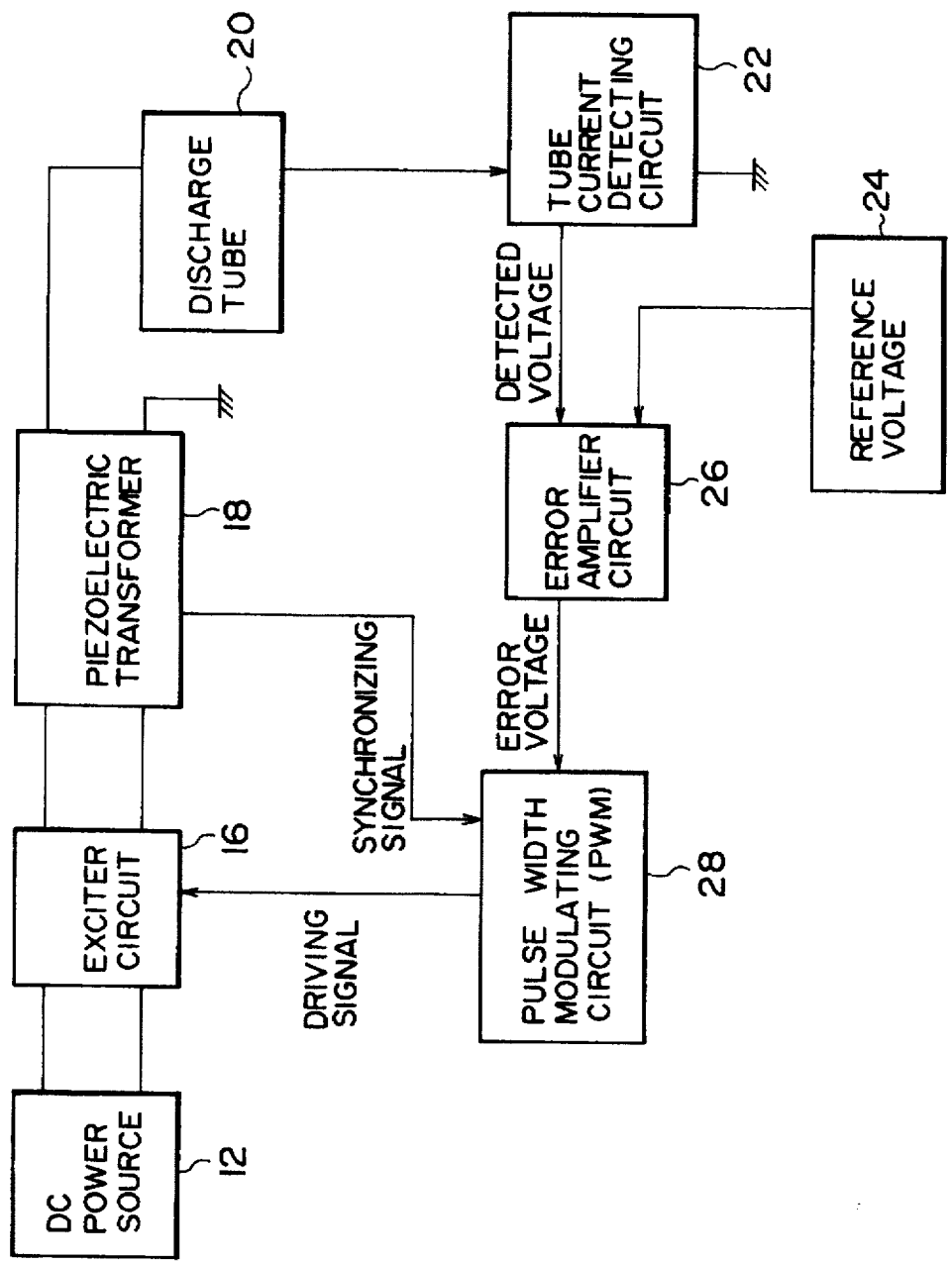
FIG. 9 is a block diagram illustrating an example of another discharge tube driving device in accordance with the present invention.

In the embodiment described above, as shown in FIG. 1, the amount of light emitted from the discharge tube 20 is regulated by supplying the control signal from the light emission controller 27 to the chopper circuit 14 thereby to step up or down the output voltage V2. The lighting control, however, is not restricted to the above configuration; it may alternatively be configured, for example, as shown in FIG. 9.

More specifically, according to this light controlling method, the control signal issued by the PWM circuit 28 is supplied to the exciter circuit 16 without using the chopper circuit 14 which is used for the circuit shown in FIG. 1. Further, a part of the voltage generated at the feedback electrode 42 of the piezoelectric transformer 16 is supplied as a synchronizing signal to the PWM circuit 28.

According to this circuit configuration, the PWM circuit 28 receives the synchronizing signal from the piezoelectric transformer 18 and oscillates the carrier wave at the self-resonant frequency of the piezoelectric transformer 18. The PWM circuit 28 compares the carrier wave and the error voltage received from the error amplifier circuit 26 and sends a driving signal with a high duty ratio as the control signal to the exciter circuit 16 as shown in FIG. 10(A) to increase the tube current; it sends a driving signal with a low duty ratio as the control signal to the exciter circuit 16 as shown in FIG. 10(B) to decrease the tube current.

Duty ratio D is represented by the following expression:

$$D = T_{ON}/T$$

where $T_{ON}$ denotes the pulse width; and T denotes the pulse interval.

In this case, with the maximum duty ratio set to 0.5, the power supplied from the piezoelectric transformer 18 to the discharge tube 20 can be controlled by controlling the duty ratio by changing the reference voltage 24 since the amplitude component of the carrier wave is approximately proportional to the duty ratio.

In the embodiment above, the description was given to the self-excited system wherein the oscillation is performed by feeding back a part of the power generated in the piezoelectric transformer 18 to the exciter circuit 16 with or without providing the transformer 18 with the feedback electrode 42. In place of the self-excitation system, the separately-excited system such as the ones shown in FIG. 11 and FIG. 12 may be adopted. The connection between the piezoelectric transformer 18 and the switch transistors 30 and 32 in these two circuits is identical to that shown in FIG. 2 except for the absence of the feedback electrode.

In the circuit configuration shown in FIG. 11, a pnp transistor is used for the first switch transistor 30 and a different type transistor, namely, an npn transistor, is used for the second switch transistor 32. The output of an oscillator 52, which is composed of, e.g. a crystal oscillator is commonly connected to the bases of the transistors 30 and 32 via a buffer 54.

According to this configuration, the first switch transistor 30 and the second switch transistor 32 are turned ON/OFF alternately in a cycle which is determined by the oscillating frequency of the oscillator 52. As a result, the voltage is applied to the input electrodes 38 and 40 of the piezoelectric transformer 18, allowing high voltage to be generated at the output electrode 44.

Figure 12:
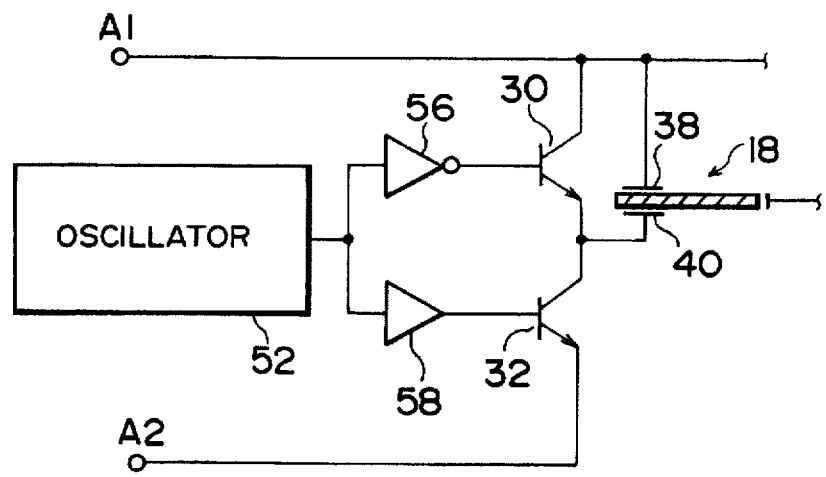
FIG. 12 is a block diagram illustrative of another separately excited driving circuit.

The circuit shown in FIG. 12 employs the same type transistors, e.g. the npn transistors for the first switch transistor 30 and the second switch transistor 32. The output of the oscillator 52 is applied to the base of one of the two transistors, i.e. the first switch transistor 30 in the illustration via an inverter 56; the output of the oscillator 52 is applied to the base of the other transistor, namely, the second switch transistor 32 via a buffer 58.

This circuit operates in the same manner as the circuit shown in FIG. 9, enabling the output electrode 44 of the piezoelectric transformer 18 to generate high voltage.

Further, this embodiment employs the thin-plate Rosen type piezoelectric transformer for the piezoelectric transformer 18. The present invention, however, is not limited to this type of piezoelectric transformer; it can be implemented with various other known types of piezoelectric transformers.

Likewise, although the embodiment given above uses, as the example of the discharge tube, the cold-cathode tube which is employed to provide the backlight for a liquid crystal display, this should not be construed restrictively; the present invention can obviously be applied to any other types of discharge tubes.

Thus, according to the discharge tube driving device of the present invention, the following outstanding advantages are obtained. In comparison with the driving device which uses the conventional electromagnetic transformer, the driving device according to the present invention can be made smaller and thinner and since it uses no winding, it is capable of preventing abnormal heat generation or fuming caused by short-circuiting of windings. In addition, since the output current can be restricted by the internal impedance of the piezoelectric transformer, the need of a ballast capacitor is eliminated and no excessive short-circuit current is allowed to flow even in case of output short-circuit.

When a part of the output of the piezoelectric transformer is fed back to drive the piezoelectric transformer by self-oscillation, the piezoelectric transformer can be driven at the self-resonant frequency of the piezoelectric transformer at all times, permitting efficient drive.

Moreover, when a light emission controller is provided, the amount of light emitted by the discharge tube can be regulated by controlling the tube current.

Figure 13:
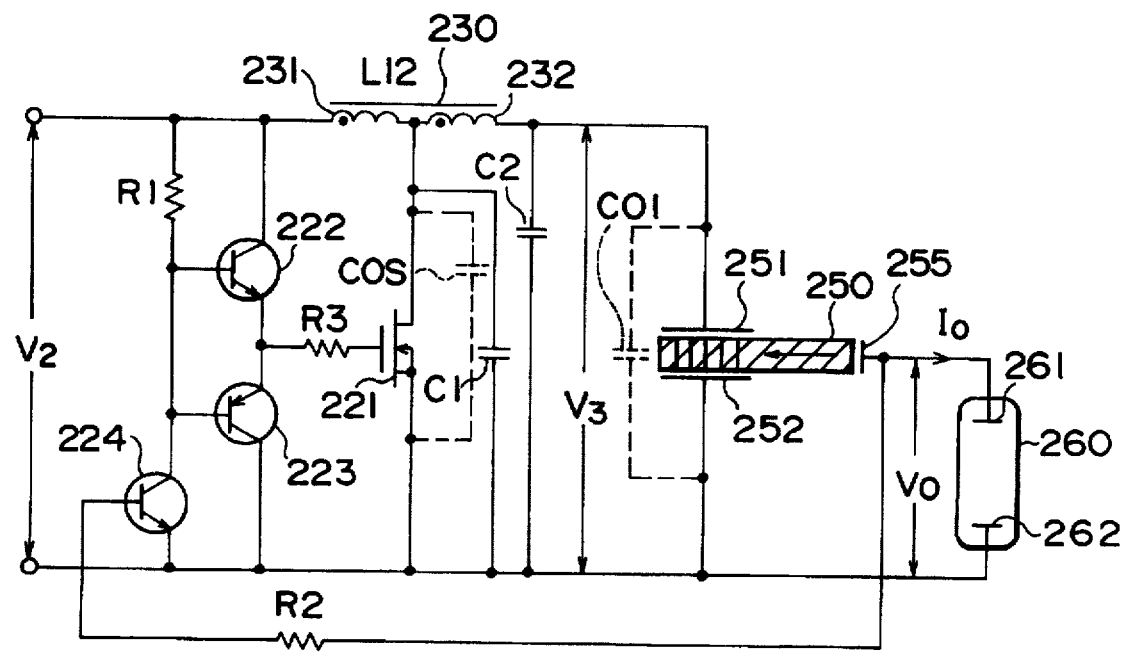
FIG. 13 is a circuit diagram of a discharge tube driving device in accordance with the present invention.

The embodiment according to the second aspect of the present invention will now be described in conjunction with the accompanying drawings. FIG. 13 is the circuit diagram of the discharge tube driving device according to the present invention. The application of DC voltage $V_2$ causes the starting current to flow via the resistor R1, turning ON a transistor 222 and a MOS field-effect transistor (hereinafter referred to as MOSFET) 221. At this time, voltage appears in the windings of an inductor 230, the dots in the drawing indicating the positive electrode, and voltage having the negative electrode on the side of an input electrode 251 of a piezoelectric transformer 250 is applied. This causes the voltage at an output electrode 255 to invert to positive voltage to turn a transistor 224 ON via a feedback resistor R2. When the transistor 224 turns ON, the transistor 222 turns OFF and the transistor 223 turns ON, momentarily turning the MOSFET 221 OFF and applying positive voltage to the input electrode 251 of the piezoelectric transformer. Then, the output voltage is inverted to be negative voltage to turn the transistor 224 OFF via the feedback resistor R2, turn the transistor 222 ON, and turn the transistor 223 OFF, thus momentarily turning the MOSFET 221 ON. After that, the same series of operations is repeated and high-frequency voltage, which has been stepped up, appears between an output electrode 255 and a common electrode 252, and the high-frequency voltage is supplied to electrodes 261 and 262 to cause a discharge tube 260 to emit light.

The inverting operation for turning ON/OFF the MOSFET 221 is the self-oscillating operation performed using the voltage generated at the output electrode of the piezoelectric transformer. Accordingly, the oscillating frequency provides the natural resonant frequency of the piezoelectric transformer 250; the resonant frequency is determined by the lengthwise dimension of the piezoelectric transformer in the case of the Rosen type. The ceramic element of the piezoelectric transformer used in the embodiment is PC-28 made by Hitachi Metals, Ltd. and it measures 28 mm long, 7.5 mm wide, and 1.0 mm thick, the resonant frequency thereof being approximately 118 kHz in the full-wavelength mode. When the Rosen type piezoelectric transformer is self-oscillated, the feedback signal detector exhibits maximum mechanical displacement. To obtain maximum output, the mechanical displacement of the right end surface, wherein the output electrode is present, needs to be maximized. As shown in FIG. 13, the feedback signal can be obtained either directly from the output electrode of the piezoelectric transformer or through an electrode or antenna which is provided near the output electrode as in the embodiment which will be discussed later.

Figure 34:
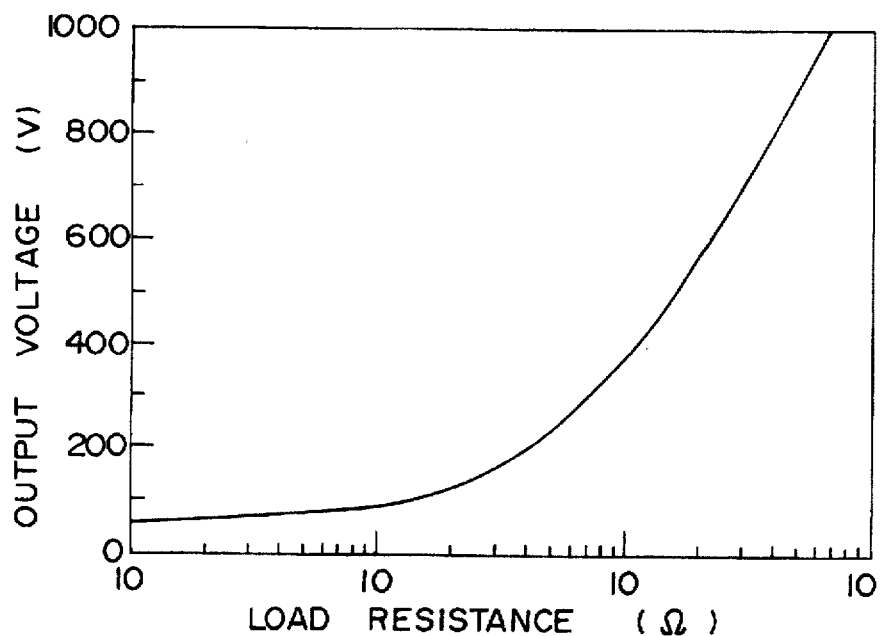
FIG. 34 is a characteristic diagram illustrative of the load resistance characteristic with respect to output voltage of the Rosen type piezoelectric transformer.
Figure 35:
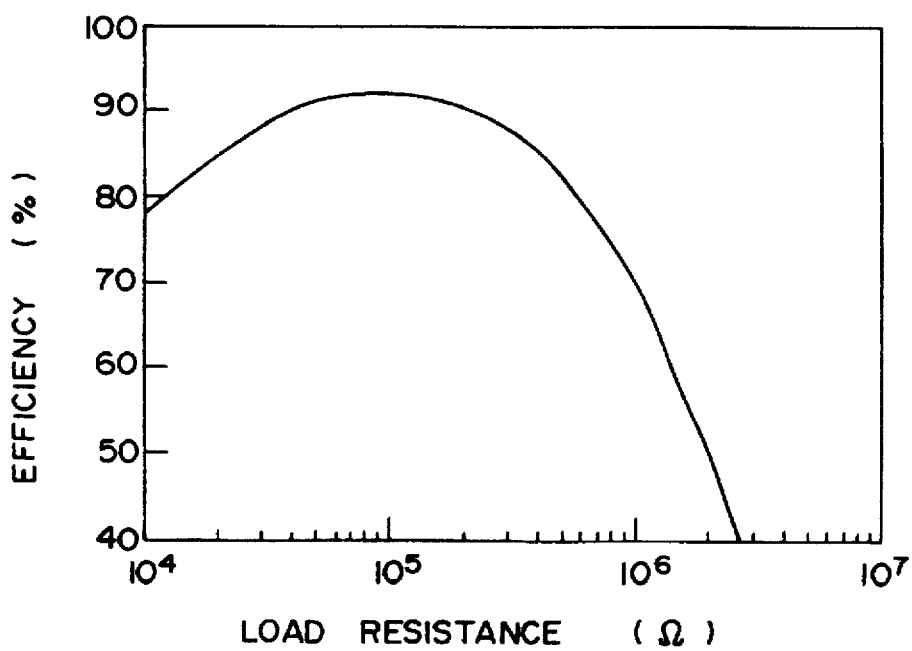
FIG. 35 is a characteristic diagram illustrative of the load resistance characteristic with respect to efficiency of the Rosen type piezoelectric transformer.

The DC voltage $V_2$ is stepped up by a turn ratio $(n_1+n_2)/n_1$ of a primary winding 231 (the number of turns is $n_1$) to a secondary winding 232 (the number of turns is $n_2$) of an electromagnetic transformer 230 before it is applied to the piezoelectric transformer. Hence, a cold-cathode tube can be driven on a 3-volt input voltage which is used in portable information terminal equipment. The electromagnetic transformer 230 according to the embodiment measures 8 mm in diameter and 3 mm in height; it is as large as an inductor 35 shown in FIG. 34. The number of turns of the primary winding $n_1$ is 15 and the number of turns of the secondary winding $n_2$ is 135. Especially good efficiency and step-up ratio can be achieved when the resonant frequency based on inductance $L_{12}$ of the electromagnetic transformer 230 (the inductance obtained from the primary winding 231 and the secondary winding 232 which are connected in series), output capacitance $C_{OS}$ of the MOSFET 221, and input capacitance $C_{O1}$ of the piezoelectric transformer is set to approximately coincide with natural resonant frequency $f_0$ of the piezoelectric transformer.

$$f_0 = \frac{1}{2\pi\sqrt{L_{12}\left\{C_{01}+C_{0s}\left(\frac{n_1}{n_1+n_2}\right)^2\right\}}} \text{ [Hz]} \quad \text{Expression 1}$$

At this time, the input voltage $V_3$ applied to the piezoelectric transformer 250 is a half-wave sinusoidal voltage which has a large fundamental wave component and a small harmful higher harmonic component, enabling better efficiency and step-up ratio than when a voltage of a waveform containing much higher harmonics is applied. If the output capacitance $C_{OS}$ of the MOSFET 221 and the input capacitance $C_{O1}$ of the piezoelectric transformer 250 do not allow the resonant frequencies to approximately coincide with each other, then capacitors $C_1$ and $C_2$ may be connected in parallel to the respective elements. As another alternative, a capacitor element may be connected in parallel to the windings of the electromagnetic transformer 230 for equivalent effect.

$$f_0 = \frac{1}{2\pi\sqrt{L_{12}\left\{C_{01}+C_2+(C_{0s}+C_1)\left(\frac{n_1}{n_1+n_2}\right)^2\right\}}} \text{ [Hz]} \quad \text{Expression 2}$$

Figure 32:
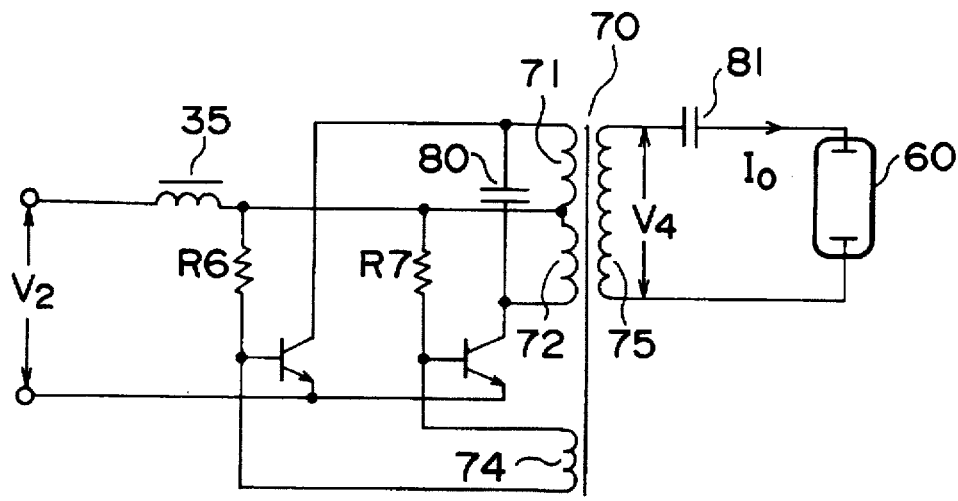
FIG. 32 is a circuit diagram of a discharge tube driving device which employs a conventional electromagnetic transformer.

In this embodiment, inverter efficiency of 75.1% was obtained when the capacitor $C_1$ was 0.0327 µF ($C_2$ is open) and inverter efficiency of 75.6% was obtained when the capacitor $C_2$ was 223 pF ($C_1$ is open) under the following input/output conditions: input voltage $V_2$=3.0 V; tube voltage $V_0$=260 V; and tube current $I_0$=2.05 mA. The electromagnetic transformer 230 has the same shape as that of the inductor 35 shown in FIG. 32; therefore, this embodiment can be made to be as large as the conventional example and yet it is capable of achieving higher inverter efficiency and reducing the input voltage to about one eighth.

Figure 17:
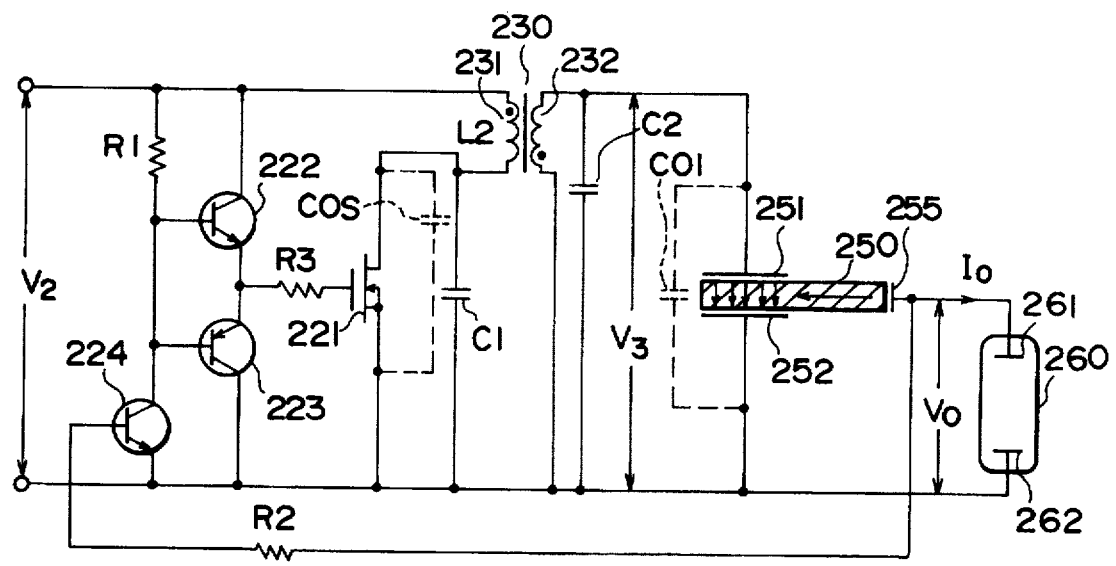
FIG. 17 is a circuit diagram of another embodiment of the discharge tube driving device in accordance with the present invention.

FIG. 17 shows the circuit diagram of still another embodiment of the present invention. This embodiment differs from the previous embodiment in that the dot-marked side of the secondary winding of the electromagnetic transformer 230 is connected to the common electrode 252 of the piezoelectric transformer. Hence, in contrast to the electromagnetic transformer 230 of the previous embodiment which is a single-winding transformer (generally known as an autotransformer) which uses the primary winding 231 as the common winding, the electromagnetic transformer 230 according to this embodiment has insulated primary winding 231 and secondary winding 232 with a turn ratio of $n_2/n_1$. The condition under which good efficiency and step-up ratio can be obtained in this embodiment is given by the following expression:

$$f_0 = \frac{1}{2\pi\sqrt{L_{12}\left\{C_{01}+C_2+(C_{0s}+C_1)\left(\frac{n_1}{n_2}\right)^2\right\}}} \text{ [Hz]} \quad \text{Expression 3}$$

where $L_2$: Inductance of secondary winding 232

Thus, the electromagnetic transformer 230 can be implemented in various forms. Further, it is apparent that the polarity of each winding marked with dots in the drawings of the embodiments can be changed according to the polarizing direction or the vibration mode of the piezoelectric transformer, or the construction of the switching means or driving/oscillating means.

Figure 14:
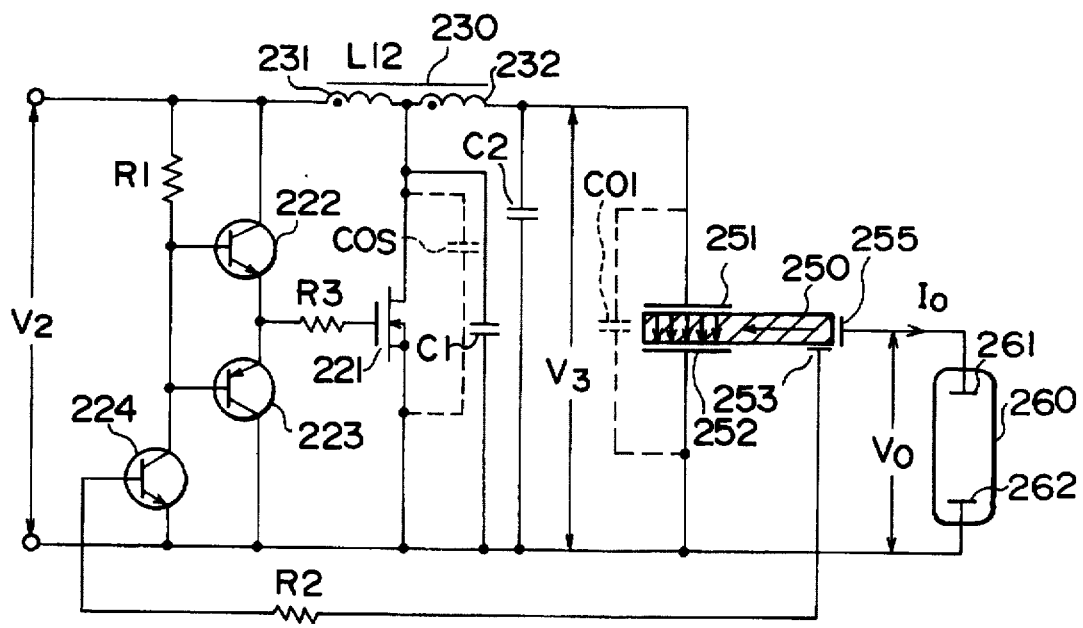
FIG. 14 is a circuit diagram of a discharge tube driving device in accordance with the present invention, wherein a self-oscillating feedback signal is detected through a feedback electrode provided near an output electrode.

FIG. 14 is the circuit diagram of the discharge tube driving device in accordance with the present invention, wherein the feedback signal for self-oscillation is detected through a feedback electrode 253 which is provided in the vicinity of the output electrode. The maximum output can be obtained through the output electrode as in the case of the example shown in FIG. 13.

Figure 15:
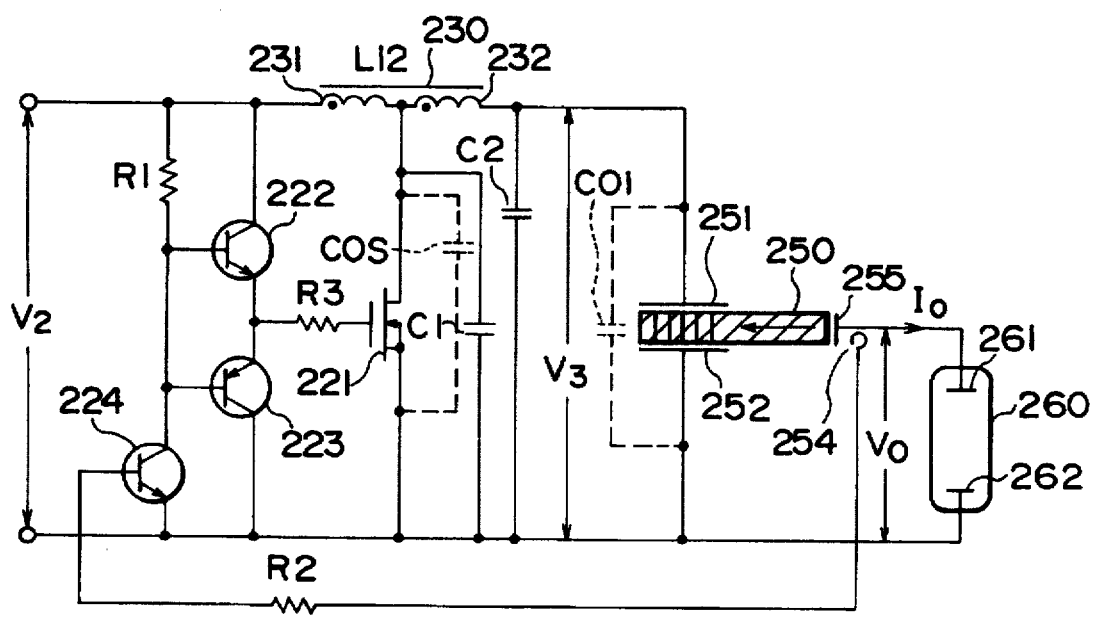
FIG. 15 is a circuit diagram of a discharge tube driving device in accordance with the present invention, wherein a self-oscillating feedback signal is detected through an antenna disposed near an output electrode.

FIG. 15 is the circuit diagram of the discharge tube driving device in accordance with the present invention, wherein the feedback signal for self-oscillation is detected through an antenna 254 which is provided in the vicinity of the output electrode. The maximum output can be obtained through the output electrode as in the case of the example shown in FIG. 13.

Figure 16:
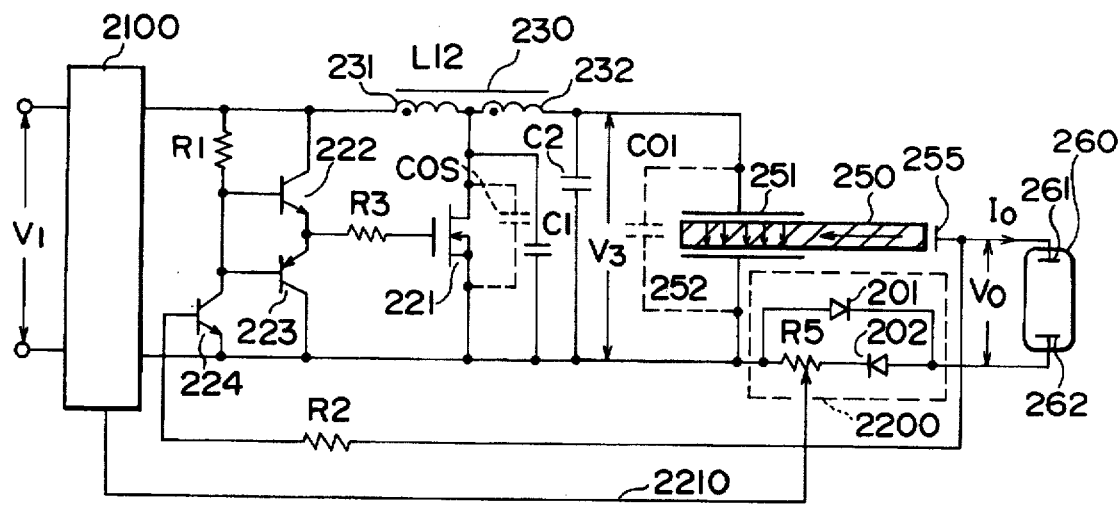
FIG. 16 is a diagram showing the circuit construction of an embodiment of the present invention, which is provided with a light controller for controlling the light emission of a discharge tube.

FIG. 16 illustrates an embodiment of the present invention which is provided with a light controlling function for regulating the amount of light emitted by the discharge tube. The embodiment is composed of the embodiment shown in FIG. 13 to which a tube current detector 2200 and a preceding-stage voltage controller 2100 have been added. The tube current detector 2200 is provided to detect the current flowing through the discharge tube 260. The tube current is detected through the variable resistor R5; the level of a detection signal 2210 can be changed by varying the resistance. Based on the detection signal, the preceding-stage voltage controller controls the voltage $V_2$ supplied to the inverter. To be more specific, when the resistance of the variable resistor R5 is decreased, the preceding-stage voltage controller increases the supply voltage $V_2$ to increase the tube current so as to ensure a constant detection signal. The preceding-stage voltage controller controls the supply voltage $V_2$ by employing a step-down type, step-up type, or inverting-type chopper control or dropper control which is a publicly known art.

According to the present invention, the voltage, which has been boosted in accordance with the turn ratio of the primary winding to the secondary winding of the electromagnetic transformer, is applied to the input electrode of the piezoelectric transformer; therefore, a discharge tube such as a cold-cathode tube can be driven at high efficiency even from a low input voltage which is used in portable electronic equipment. Even higher efficiency and step-up ratio can be achieved when the resonant frequency based on the inductance of the primary winding or secondary winding of the electromagnetic transformer and a parallel capacitance, which includes the parasitic capacitance of the switching means, or a parallel capacitance, which includes the input capacitance of the piezoelectric transformer is set to nearly coincide with the natural resonant frequency of the piezoelectric transformer itself. Moreover, since the piezoelectric transformer has a high output impedance, there is no need for the ballast capacitor for restricting the tube current which used to be employed for the conventional electromagnetic transformer type. In addition, the use of the piezoelectric transformer enables a smaller and thinner discharge tube driving device to be produced at reduced cost due to the significantly simpler construction of the piezoelectric transformer compared with the conventional electromagnetic transformer.

Figure 18:
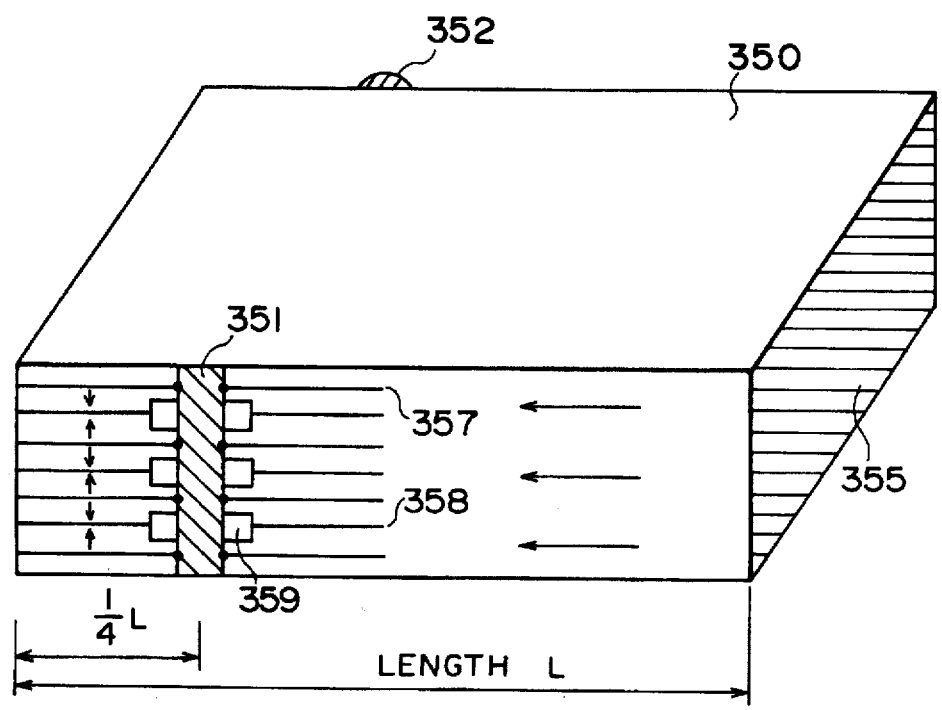
FIG. 18 is a perspective view of a multilayer type piezoelectric transformer in accordance with the present invention.
Figure 19:
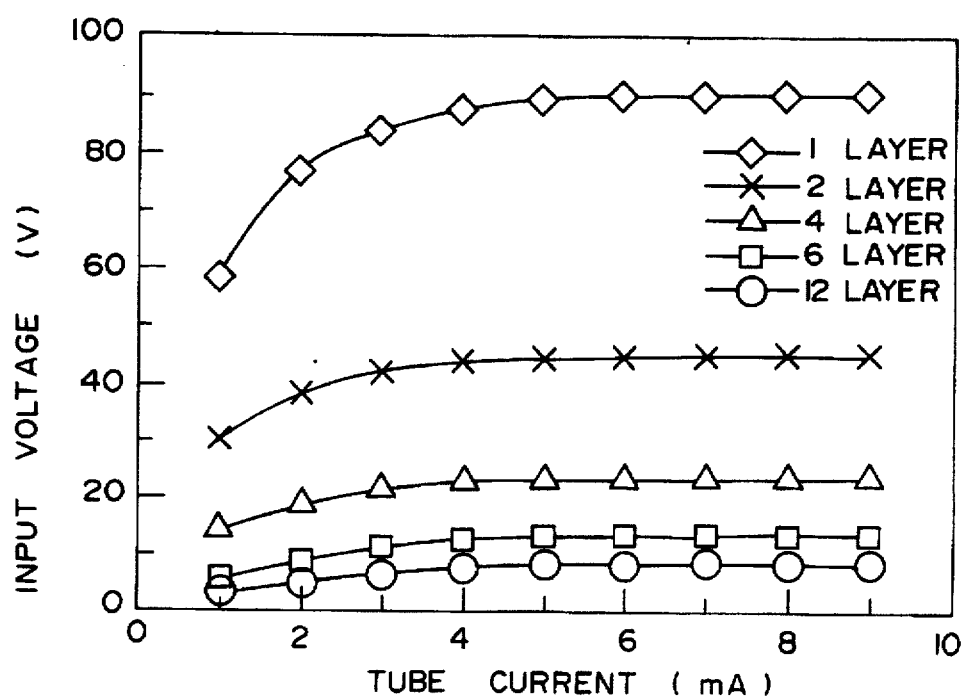
FIG. 19 shows the tube current characteristic with respect to the input voltage of the multilayer type piezoelectric transformer in accordance with the present invention.

The embodiment according to the third aspect of the present invention will now be described with reference to the accompanying drawings. FIG. 18 is the perspective view of the multilayer type piezoelectric transformer in accordance with the present invention. To fabricate the multilayer type piezoelectric transformer, a green sheet made of PZT ceramic (made by Hitachi Metals, Ltd.; Trade name: HCEPC-28) is first produced. Then, platinum internal electrodes (input internal electrodes) 357 and 358 are printed on a part of the green sheet by employing the screen printing technique. In the next step, the sheet with the electrodes printed on is laminated and pressed together and sintered. After that, the laminated, sintered sheet is cut and polished, input external electrodes 351, 352, and an output electrode 355 are provided by silver-baking, and the internal electrode 357 is connected to the external electrode 351 and the internal electrode 358 to the external electrode 352. At this time, in order to prevent the internal electrode 351 from contacting the external electrode 352 and the internal electrode 358 from contacting the external electrode 351, an insulating layer 359 is provided between these electrodes. Polarizing treatment is carried out in the direction of the thickness of the driving section and in the direction of the length of the power generating section. This completes the multilayer type piezoelectric transformer. When this multilayer type piezoelectric transformer is driven in the full-wavelength mode which is generally used, a portion at a quarter of the full length exhibits the smallest vibration displacement. Hence, when the external electrodes 351 and 352 are installed at that portion, the characteristics of the multilayer type piezoelectric transformer are not impaired even when the external electrodes 351 and 352 are fixed with external terminals. FIG. 19 shows the tube current characteristic with respect to the input voltage when a cold-cathode tube is the load which uses the number of layers of the multilayer type piezoelectric transformer thus fabricated as the parameter thereof; FIG. 19 shows the tube current characteristic with respect to efficiency. The cold-cathode tube measures 3.0 mm, in diameter and 210 mm in length. The multilayer type piezoelectric transformer measures 30 mm long, 6.5 mm wide, and 1.2 mm thick, the resonant frequency being approximately 111 kHz in the full-wavelength mode although it depends on the tube current.

Figure 20:
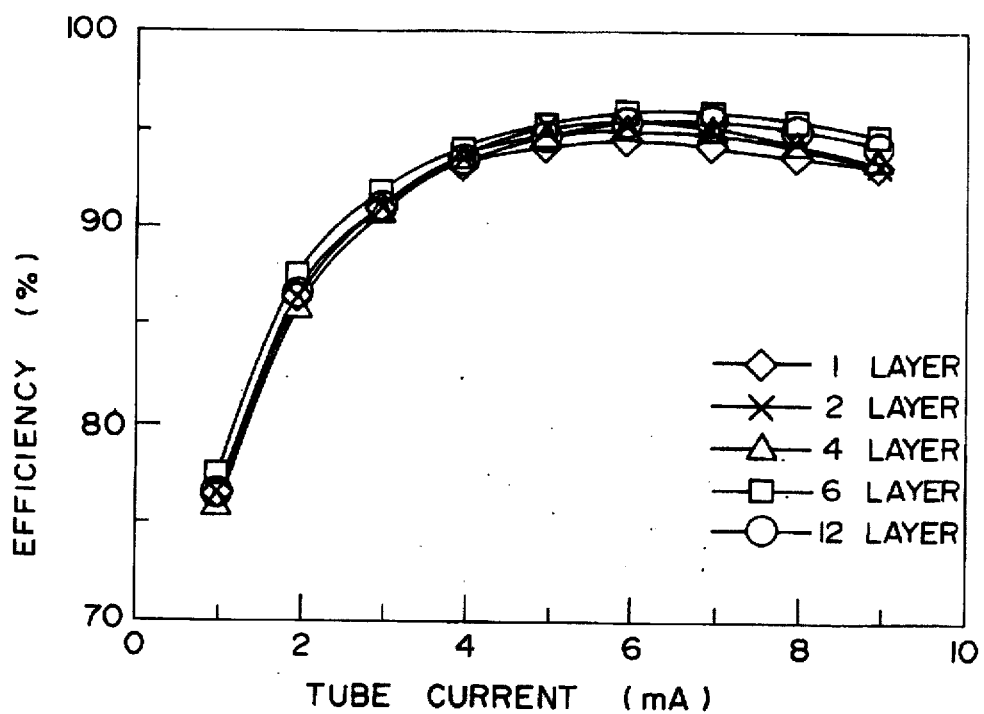
FIG. 20 shows the tube current characteristic with respect to the efficiency of the multilayer type piezoelectric transformer in accordance with the present invention.

The cold-cathode tube used is the type which is installed along the length of a liquid crystal display of a notebook personal computer. According to the characteristic shown in FIG. 19, to obtain a tube current of 5 to 7 mA, an AC input voltage of more than 23 to 90 V is required for a fewer laminated layers. A multilayer type piezoelectric transformer of six layers or more provides the tube current required for the liquid crystal display for the notebook personal computer from an AC input voltage of 14 V or less. According to the characteristics shown in FIG. 20, transformer efficiency or 90% or higher is obtained in the zone of a tube current of 3 mA or more, the efficiency being comparable to that of the conventional electromagnetic transformer.

Figure 28:
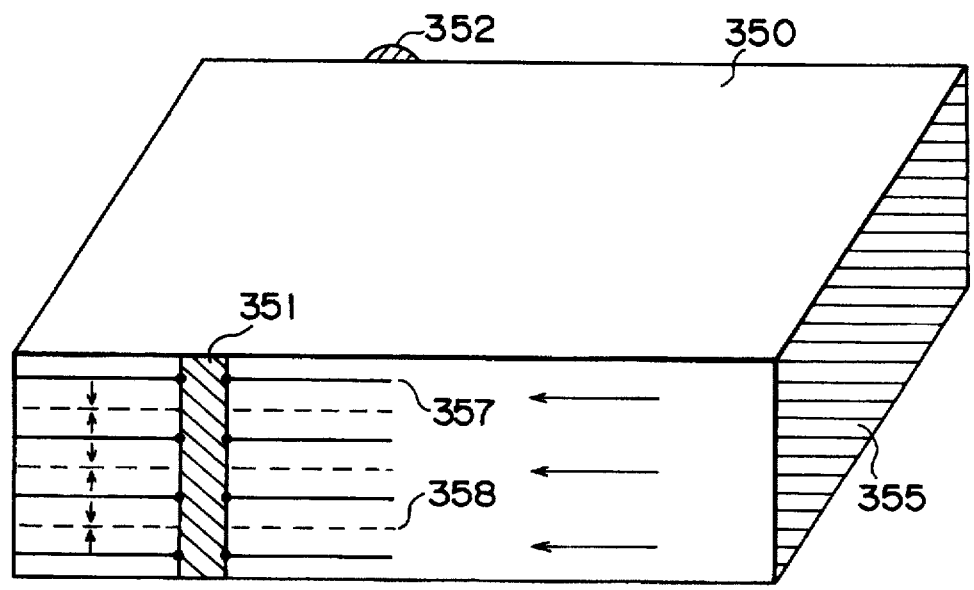
FIG. 28 is a perspective view of a multilayer type piezoelectric transformer of another embodiment in accordance with the present invention.
Figure 29:
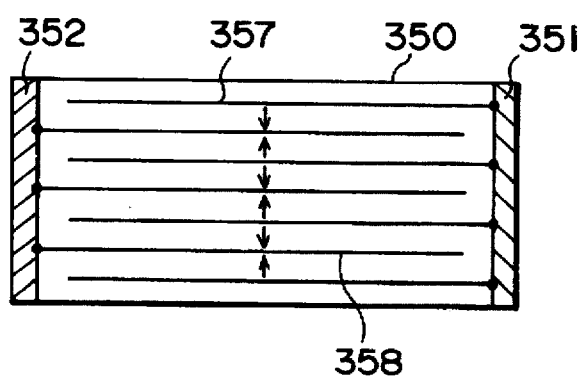
FIG. 29 is a lengthwise cross-sectional view of the multilayer type piezoelectric transformer of another embodiment in accordance with the present invention.
Figure 30:
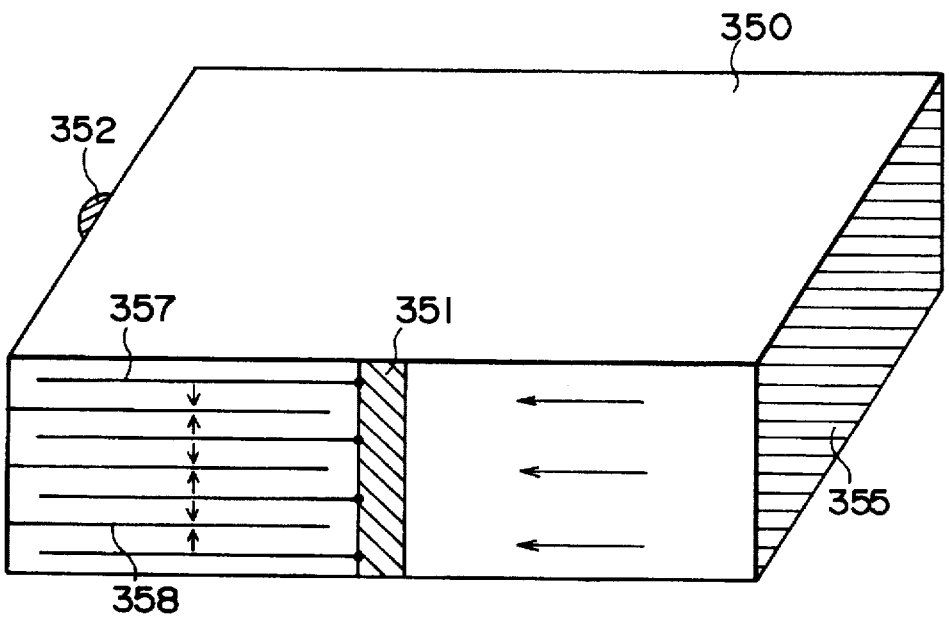
FIG. 30 is a perspective view of a multilayer type piezoelectric transformer of still another embodiment in accordance with the present invention.

Other embodiments of the multilayer type piezoelectric transformers according to the present invention are shown in FIG. 28 and FIG. 29. FIG. 28 is the perspective view; FIG. 29 is the lengthwise cross-sectional view. By slightly shifting the opposing internal electrodes 357 and 358 in the direction of the width, the internal electrodes and the external electrodes are connected without the need of the insulating layer 359. Still another embodiment of the multilayer type piezoelectric transformer in accordance with the present invention is shown in FIG. 30. In the case of this embodiment, the opposing internal electrodes 357 and 358 are slightly shifted lengthwise to connect the internal electrodes to the external electrodes without using the insulating layer 359; the external electrodes 351 and 352 are provided on the end surface and at the portion located at the half point of the full length which are both subjected to the largest vibration displacement in the full-wavelength mode. In this case, the external electrodes are connected with the external terminals via lead wires, which have sufficient strength, rather than directly connecting them.

Figure 21:
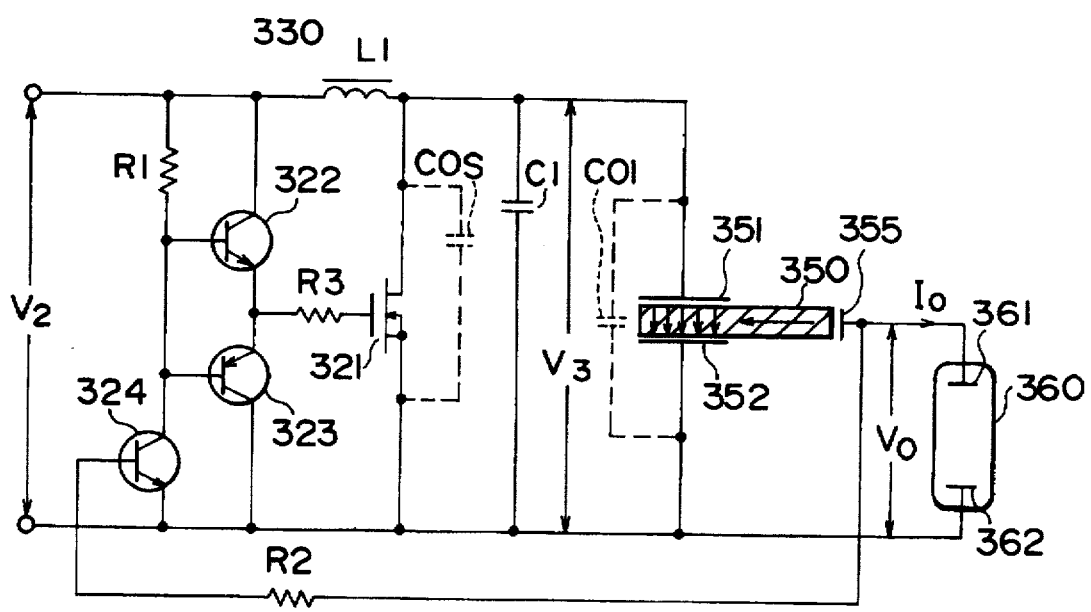
FIG. 21 is a circuit diagram of the discharge tube driving device which employs the multilayer type piezoelectric transformer in accordance with the present invention.

Portable information equipment such as a notebook personal computer uses DC voltage for the input power supply. An inverter, which converts DC to AC, is added to the multilayer type piezoelectric transformer according to the present invention, so that it is employed as the discharge tube driving device for the portable information equipment. FIG. 21 is the circuit diagram of the discharge tube driving device in accordance with the present invention. The following describes the operation of the circuit. The moment the DC voltage $V_2$ is applied, the positive voltage ($V_2$) is applied to the input electrodes 351 and 352 of the multilayer type piezoelectric transformer 350 via an inductor 330; immediately after this, a starting current comes in through the resistor $R_1$, turning ON a transistor 322 and a MOS field-effect transistor (hereinafter referred to as "MOSFET") 321, and input voltage $V_3$ of the multilayer type piezoelectric transformer becomes zero. Specifically, during that period, a pulse-shaped voltage is applied to the input electrodes of the multilayer type piezoelectric transformer; therefore, a positive voltage appears at the output electrode 355 due to the operating principle, turning a transistor 324 ON via the feedback resistor $R_2$. When the transistor 324 is turned ON, the transistor 322 is turned OFF and a transistor 323 is turned ON; therefore, the MOSFET 321 is momentarily turned OFF, causing the positive voltage to be applied again to the input electrode 351 of the multilayer type piezoelectric transformer. This causes the output voltage of the multilayer type piezoelectric transformer to be inverted to negative, turning the transistor 324 OFF, the transistor 322 ON, and the transistor 323 OFF via the feedback resistor $R_2$; therefore, the MOSFET 321 is momentarily turned ON. After that, the same series of operations is repeated and high-frequency voltage, which has been stepped up, is generated between the output electrode 355 and a common electrode 352 of the multilayer type piezoelectric transformer and the high-frequency voltage is applied to electrodes 361 and 362 to cause a discharge tube 360 to emit light.

The inverting operation for turning ON/OFF the MOSFET 321 is the self-oscillating operation performed using the voltage generated at the output electrode of the multilayer type piezoelectric transformer 350. In this self-oscillation, the feedback signal detector exhibits the greatest mechanical displacement. To obtain maximum output, the mechanical displacement of the right end surface, wherein the output electrode is present, needs to be maximized. As shown in FIG. 21, the feedback signal can be obtained either directly from the output electrode of the multilayer type piezoelectric transformer or through an electrode or antenna which is provided near the output electrode as in the embodiment which will be discussed later.

Figure 25:
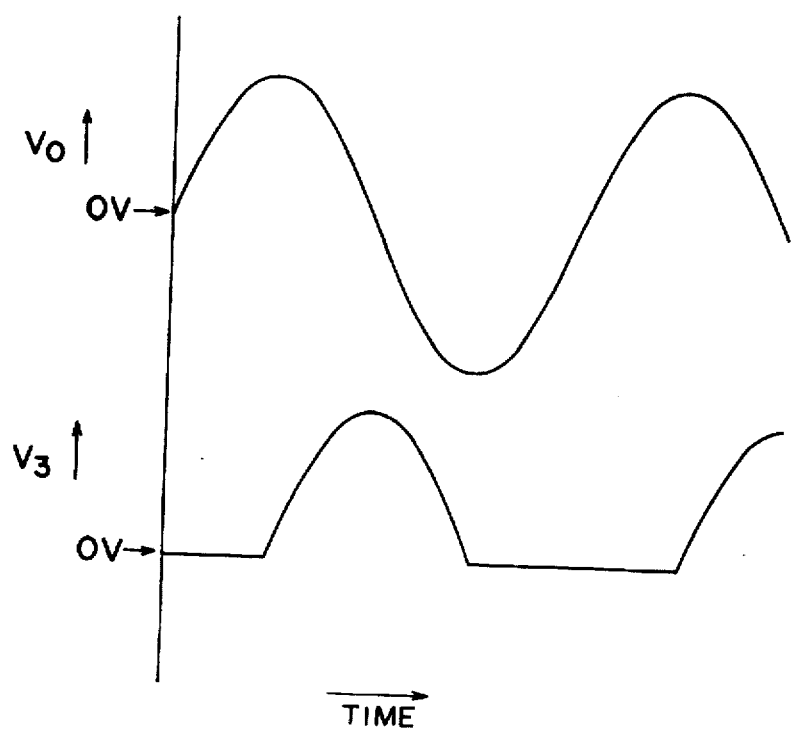
FIG. 25 shows the waveforms of the input voltage and the output voltage of the multilayer type piezoelectric transformer in the discharge tube driving device in accordance with the present invention.

The example given in FIG. 21 has an E-class amplifier circuit composed of an inductor 330, MOSFET 321, and the multilayer type piezoelectric transformer 350. The E-class amplifier circuit was proposed by N. O. Sokal et al. in the United States in 1975; it is explained on pages 153 to 155 of "Story about Amplification" written by Genzaburo Kuraishi, published by Nikkan Kogyo Shimbunsha. The resonance based on the inductance $L_1$ of the inductor 330, the output capacitance $C_{OS}$ of the MOSFET 321, and the input capacitance $C_{O1}$ of the multilayer type piezoelectric transformer 350 causes the input voltage $V_3$ applied to the multilayer type piezoelectric transformer 350 to exhibit a half-wave sinusoidal voltage waveform as illustrated in FIG. 25, resulting in lower switching loss of the MOSFET 321. This indicates the characteristics of the E-class amplifier circuit. Further, when the frequency of the resonance is set to approximately coincide with the natural resonant frequency $f_0$ of the multilayer type piezoelectric transformer 350 as shown by the expression given below, especially high efficiency and step-up ratio can be obtained because there will be a smaller harmful higher harmonic component and a larger fundamental wave component:

$$f_0 = \frac{1}{2\pi \sqrt{L_1 (C_{OS} + C_{O1})}} \text{ [Hz]} \qquad \text{Expression 4}$$

If the output capacitance $C_{OS}$ of the MOSFET 321 and the input capacitance $C_{O1}$ of the multilayer type piezoelectric transformer 350 do not allow the resonant frequencies to approximately coincide with each other, then the capacitor $C_1$ may be connected in parallel to the respective elements. As another alternative, a capacitor may be connected in parallel to the inductor 330 for equivalent effect.

Figure 26:
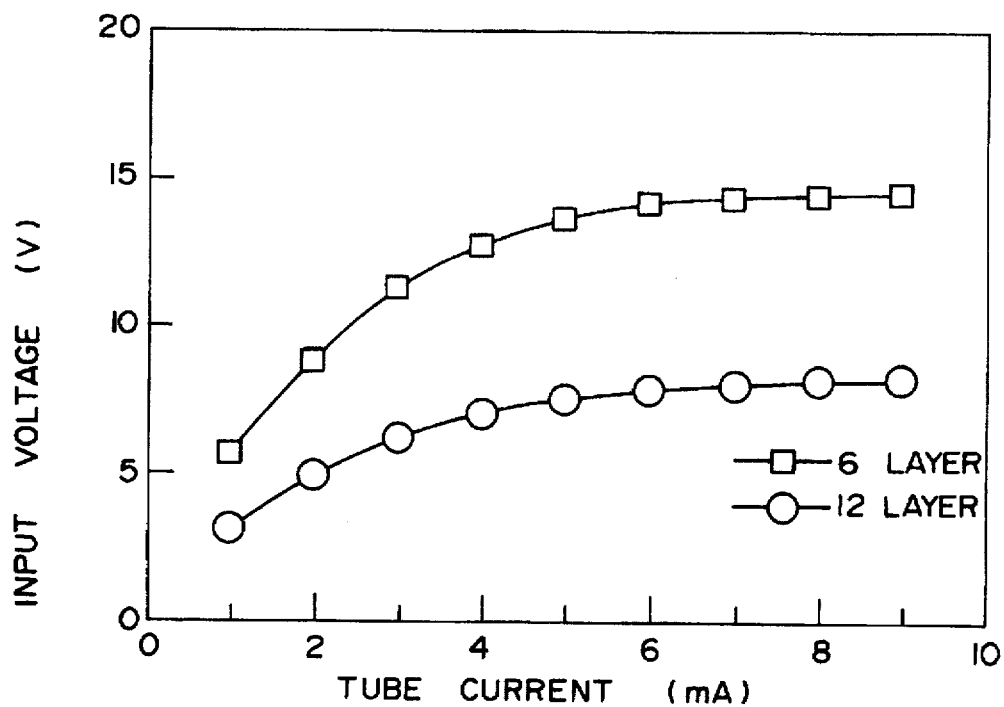
FIG. 26 shows the tube current characteristic with respect to the input voltage of the discharge tube driving device in accordance with the present invention.
Figure 27:
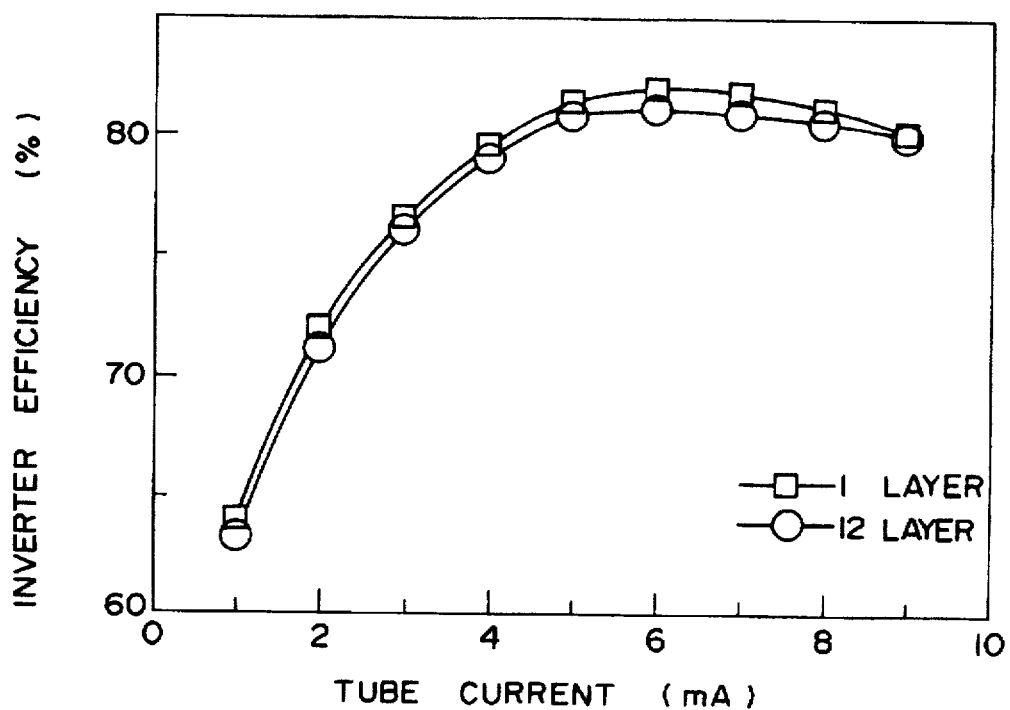
FIG. 27 shows the tube current characteristic with respect to the efficiency of the discharge tube driving device in accordance with the present invention.

FIG. 26 shows the characteristic of this embodiment in tube current with respect to input voltage observed when 6-layer and 12-layer piezoelectric transformers are used; the transformers being the same type as that shown in FIG. 18 and having the circuit configuration shown in FIG. 21; FIG. 27 shows the characteristic of this embodiment in tube current with respect to efficiency. The same cold-cathode tube measuring 3.0 mm in diameter and 210 mm in length stated above was used. According to the characteristics shown in FIG. 26, a tube current of 5 to 7 mA can be obtained from a DC input voltage of 14 V or less in the case of the 6-layer piezoelectric transformer, or from a DC input voltage of 8 V or less in the case of the 12-layer piezoelectric transformer. The DC input voltage can be further decreased by increasing the number of the layers. For example, a 30-layer piezoelectric transformer is capable of providing a tube current of 5 to 7 mA from a DC input voltage of 3 V or less. As it is understood from the characteristics shown in FIG. 27, an inverter efficiency of 80% or more is obtained in the zone of the required tube current of 5 mA or more. This efficiency is as high as that obtained with the inverter which uses an electromagnetic transformer.

In this embodiment, the resistance values of the feedback resistor $R_2$ and a starting resistor $R_1$ are adjusted to obtain a proper I/O phase. High voltage of high frequency is generated at the output electrode of the multilayer type piezoelectric transformer 350; therefore, induced voltage may be generated in the parts or wiring disposed in the vicinity thereof, leading to oscillation which deviates from the foregoing I/O phase with a resultant lower efficiency and step-up ratio. The voltage waveform of this embodiment is shown in FIG. 25.

Figure 22:
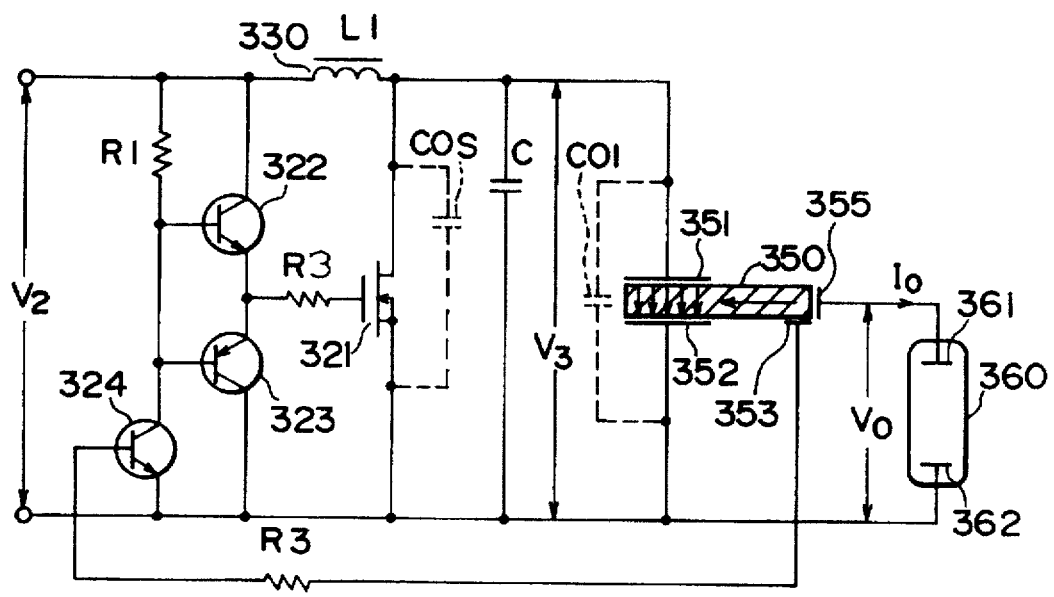
FIG. 22 is a circuit diagram of the discharge tube driving device in accordance with the present invention, wherein a feedback signal is detected through a feedback electrode provided near an output electrode.

FIG. 22 shows the circuit diagram of the discharge tube driving device in accordance with the present invention, wherein the feedback signal is detected through a feedback electrode 353 provided near the output electrode. The maximum output can be obtained through the output electrode as in the example shown in FIG. 21.

Figure 23:
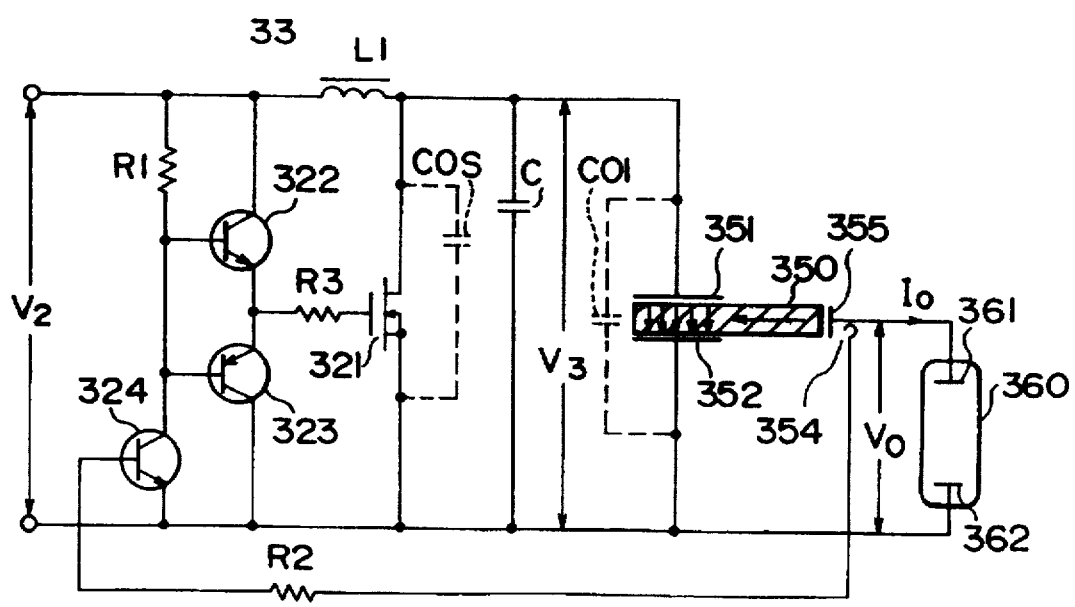
FIG. 23 is a circuit diagram of the discharge tube driving device in accordance with the present invention, wherein a feedback signal is detected through an antenna disposed near an output electrode.

FIG. 23 shows the circuit diagram of the discharge tube driving device in accordance with the present invention, wherein the feedback signal is detected through an antenna 354 disposed near the output electrode. The maximum output can be obtained through the output electrode as in the example shown in FIG. 23.

Figure 24:
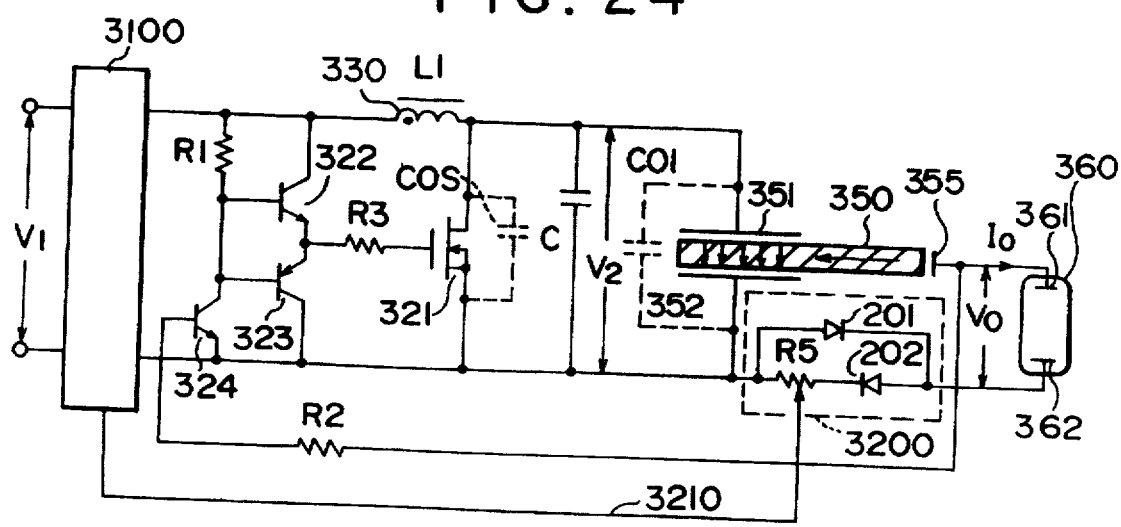
FIG. 24 is a diagram showing the circuit construction of an embodiment of the present invention, which is provided with a light controller for controlling the light emission of a discharge tube.

FIG. 24 shows an embodiment of the present invention which is provided with a light controlling function for regulating the amount of light emitted by the discharge tube. The embodiment is composed of the embodiment shown in FIG. 23 to which a tube current detector 3200 and a preceding-stage voltage controller 3100 have been added. The tube current detector 3200 is provided to detect the current flowing through the discharge tube 360. The tube current is detected through the variable resistor R5; the level of a detection signal 3210 can be changed by varying the resistance value. Based on the detection signal, the preceding-stage voltage controller controls the supply voltage $V_2$ applied to the inverter. To be more specific, when the resistance of the variable resistor R5 is decreased, the preceding-stage voltage controller increases the supply voltage $V_2$ to increase the tube current so as to ensure a constant detection signal. The preceding-stage voltage controller controls the supply voltage $V_2$ by employing a step-down type, step-up type, or inverting-type chopper control or dropper control which is a publicly known art. There is another light control method wherein the tube current is controlled through duty control for continuing the application of the supply voltage $V_2$.

Figure 31:
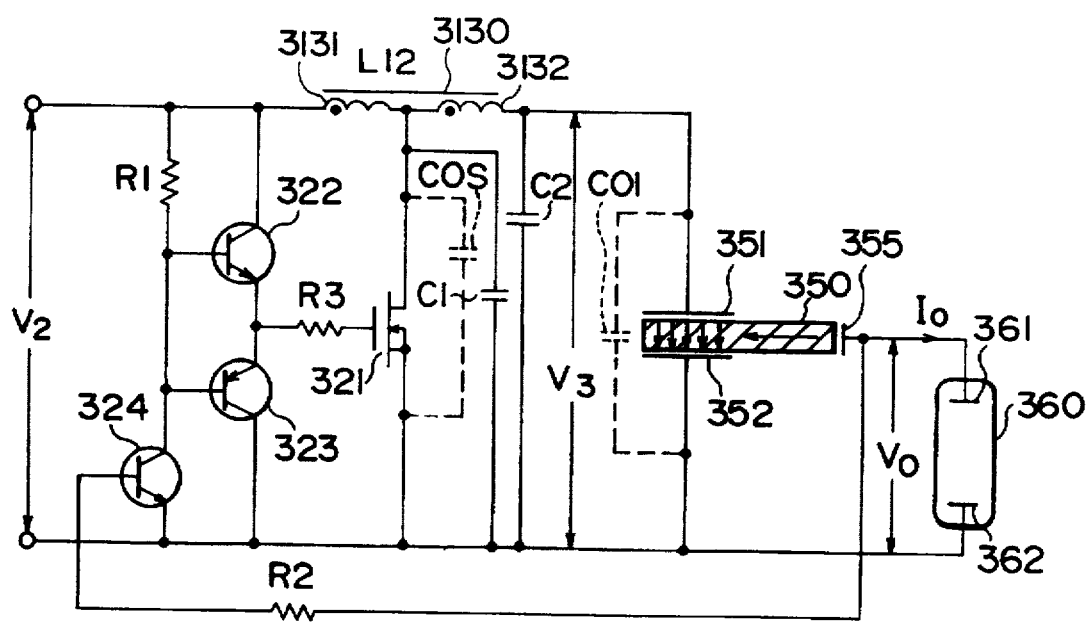
FIG. 31 is a circuit diagram of a discharge tube driving device which employs the multilayer type piezoelectric transformer in accordance with the present invention.

Another embodiment of the present invention will now be descried, referring to an accompanying drawing. FIG. 31 is the circuit diagram of a discharge tube driving device in accordance with the present invention. When the DC voltage $V_2$ is applied, high-frequency voltage, which has been boosted, appears between the output electrode 355 and the common electrode 352 and the high-frequency voltage is applied to the electrodes 361 and 362, causing the discharge tube 360 to emit light. The inverting operation for turning ON/OFF the MOSFET 321 is the self-oscillating operation performed using the voltage generated at the output electrode of the piezoelectric transformer.

The DC voltage $V_2$ is stepped up by a turn ratio $(n_1+n_2)/n_1$ of a primary winding 3131 (the number of turns is $n_1$) to a secondary winding 3132 (the number of turns is $n_2$) of an electromagnetic transformer 3130 before it is applied to the piezoelectric transformer. Hence, a cold-cathode tube can be driven on a 3-volt input voltage which is used in portable information terminal equipment.

Thus, the present invention can be implemented in various forms. Further, it is apparent that the present invention can be implemented with different polarizing directions or vibration modes of the piezoelectric transformer, or constructions of the switching means or driving/oscillating means from those illustrated herein.

According to the present invention, the driving section of the multilayer type piezoelectric transformer consists of multiple layers; therefore, it is capable of driving a discharge tube such as a cold-cathode tube at high efficiency even from a low input voltage used in portable electronic equipment.

Even higher efficiency and step-up ratio can be obtained when the resonance frequency based on the inductor provided in series with the multilayer type piezoelectric transformer and a parallel capacitance, which includes the parasitic capacitance of the switching means, or a parallel capacitance, which includes the input capacitance of the multilayer type piezoelectric transformer is set to nearly coincide with the natural resonant frequency of the multilayer type piezoelectric transformer itself. Moreover, since the multilayer type piezoelectric transformer has a high output impedance, there is no need for the ballast capacitor for restricting the tube current which used to be employed for the conventional electromagnetic transformer type. In addition, the use of the multilayer type piezoelectric transformer enables a smaller and thinner discharge tube driving device to be achieved because it is significantly simpler and in construction and smaller than the conventional electromagnetic transformer.

It is to be understood that the present invention is not limited to the specific embodiments thereof and that other modifications are possible within the scope of the appended claims.

What I claim is:

1. A piezoelectric transformer comprising:
   a first region polarized in the direction of length; and
   a second region polarized in the direction of thickness;
   said first and second regions comprising a single piezoelectric body made of sintered sheets of piezoelectric material wherein a piezoelectric element and an internal electrode are laminated alternately on the sheets only in said second region polarized in the direction of thickness, said internal electrode is connected to an external electrode every other layer, and said sheets are sintered into one piece;
   wherein the efficiency of the transformer is increased in correspondance with the number of sheets, so as to provide a relatively high output current from a relatively low input voltage.

2. A piezoelectric transformer according to claim 1, wherein said internal electrode and said external electrode are connected at a point which is located approximately a quarter of the full length measured from an end surface of the second region.

3. A driving device for a discharge tube, comprising:
   a DC input power source;
   an electromagnetic transformer having a primary winding with one end connected to said DC input power source and the other end connected to a switching means and a secondary winding with one end connected to a piezoelectric transformer; and
   a driving/oscillating means for causing said switching means to be self-oscillated by feedback from an output of said piezoelectric transformer;
   wherein an output electrode of said piezoelectric transformer is connected to said discharge tube; and
   wherein said driving/oscillating means is self-oscillated by feedback from an antenna which is disposed in the vicinity of an output electrode of said piezoelectric transformer.

4. A driving device for a discharge tube comprising:
   a DC input power source;
   an inductance element, one end of a coil thereof being connected to said DC input power source;
   a switching means connected to the other end of said coil of said inductance element;
   a piezoelectric transformer which is connected in parallel to said switching means;
   and a driving/oscillating means for said switching means which is self-oscillated by feedback from an output of said piezoelectric transformer;
   wherein the output of said piezoelectric transformer is supplied to a discharge tube; and
   wherein said driving device further comprises a driving/oscillating means for said switching means which is self-oscillated by feedback from an antenna disposed in the vicinity of an output electrode of said piezoelectric transformer;
   wherein said transformer comprises:
   a first region polarized in the direction of length; and
   a second region polarized in the direction of thickness;
   said first and second regions comprising sheets of piezoelectric material;
   wherein a piezoelectric element and an internal electrode are laminated alternatively on the sheets only in said second region polarized in the direction of thickness, said internal electrode is connected to an external electrode every other layer, and said sheets are sintered into one piece.

* * * * *